US012324279B2

(12) United States Patent
Hirano et al.

(10) Patent No.: US 12,324,279 B2
(45) Date of Patent: Jun. 3, 2025

(54) NITRIDE SEMICONDUCTOR ULTRAVIOLET LIGHT-EMITTING ELEMENT

(71) Applicant: NIKKISO CO., LTD., Tokyo (JP)

(72) Inventors: Akira Hirano, Aichi (JP); Yosuke Nagasawa, Nara (JP)

(73) Assignee: NIKKISO CO., LTD., Tokyo (JP)

( * ) Notice: Subject to any disclaimer, the term of this patent is extended or adjusted under 35 U.S.C. 154(b) by 449 days.

(21) Appl. No.: 17/926,269

(22) PCT Filed: Jun. 24, 2020

(86) PCT No.: PCT/JP2020/024827
§ 371 (c)(1),
(2) Date: Nov. 18, 2022

(87) PCT Pub. No.: WO2021/260849
PCT Pub. Date: Dec. 30, 2021

(65) Prior Publication Data
US 2023/0207731 A1   Jun. 29, 2023

(51) Int. Cl.
*H01L 33/32* (2010.01)
*H01L 33/00* (2010.01)
(Continued)

(52) U.S. Cl.
CPC .... *H10H 20/825* (2025.01); *H10H 20/01335* (2025.01); *H10H 20/812* (2025.01); *H10H 20/818* (2025.01)

(58) Field of Classification Search
CPC ........... H10H 20/825; H10H 20/01335; H10H 20/01; H10H 20/818; H10H 20/817; H10H 20/815; H10H 20/821
See application file for complete search history.

(56) References Cited

U.S. PATENT DOCUMENTS 10,896,818 B2 *   1/2021   Han .................. H01L 21/02647
11,049,999 B2 *   6/2021   Hirano ................. H10H 20/812
(Continued)

FOREIGN PATENT DOCUMENTS

JP      2002016000 A    1/2002
JP      2006060164 A    3/2006
(Continued)

OTHER PUBLICATIONS

Kojima et al., "Carrier localization structure combined with current micropaths in AlGaN quantum wells grown on an AlN template with macrosteps," Applied Physics letter 114, Jan. 7, 2019, 6 pages.
(Continued)

*Primary Examiner* — Nikolay K Yushin
(74) *Attorney, Agent, or Firm* — Andrew L. Dunlap; Haynes Beffel & Wolfeld LLP

(57) ABSTRACT

A nitride semiconductor ultraviolet light-emitting element is provided. The element includes a light-emitting element structure part with an n-type layer, an active layer, and a p-type layer stacked vertically, which are made of AlGaN-based semiconductors with wurtzite structure. The n-type layer has an n-type AlGaN-based semiconductor, the active layer has well layers including an AlGaN based semiconductor, and the p-type layer has a p-type AlGaN-based semiconductor. Each semiconductor layer in the n-type and the active layers is an epitaxially grown layer having a surface on which multi-step terraces parallel to the (0001) plane are formed. The n-type layer has first Ga-rich regions which include n-type AlGaN regions in which an AlGaN composition ratio is an integer ratio of $Al_1Ga_1N_2$. The well layer includes a second Ga-rich region, which includes an AlGaN region in which an AlGaN composition ratio is an integer ratio of $Al_1Ga_2N_3$.

11 Claims, 17 Drawing Sheets

(51) Int. Cl.
    *H10H 20/01*     (2025.01)
    *H10H 20/812*     (2025.01)
    *H10H 20/818*     (2025.01)
    *H10H 20/825*     (2025.01)

(56) References Cited

U.S. PATENT DOCUMENTS

| | | | |
|---|---|---|---|
| 11,152,543 B2 * | 10/2021 | Hirano | H10H 20/811 |
| 2015/0243856 A1 | 8/2015 | Yamada et al. | |
| 2017/0263817 A1 | 9/2017 | Hirano et al. | |
| 2018/0261725 A1 | 9/2018 | Kaneda et al. | |
| 2020/0357953 A1 | 11/2020 | Hirano et al. | |
| 2021/0043804 A1 | 2/2021 | Hirano et al. | |

FOREIGN PATENT DOCUMENTS

| | | | |
|---|---|---|---|
| JP | 2016088803 A | 5/2016 | |
| WO | 2014178288 A1 | 11/2014 | |
| WO | 2016157518 A1 | 10/2016 | |
| WO | 2017013729 A1 | 1/2017 | |
| WO | 2019102557 A1 | 5/2019 | |
| WO | 2019159265 A1 | 8/2019 | |

OTHER PUBLICATIONS

Nagasawa et al., "Comparison of AlxGa1?xN multiple quantum wells designed for 265 and 285nm deep-ultraviolet LEDs grown on AIN templates having macrosteps," Applied Physics Express 12, Jun. 4, 2019, 6 pages.

* cited by examiner

NITRIDE SEMICONDUCTOR ULTRAVIOLET LIGHT-EMITTING ELEMENT

TECHNICAL FIELD

The present invention relates to a nitride semiconductor ultraviolet light-emitting element having a peak emission wavelength within a range of 300 nm to 327 nm and comprising a light-emitting element structure part with an n-type layer, an active layer, and a p-type layer stacked vertically which are made of AlGaN-based semiconductors with wurtzite structure.

BACKGROUND ART

In general, there are a lot of nitride semiconductor light-emitting elements with a light-emitting element structure comprising a plurality of nitride semiconductor layers formed by epitaxial growth on a substrate such as sapphire. A nitride semiconductor layer is represented by the general formula: $Al_{1-x-y}Ga_xIn_yN$ ($0 \leq x \leq 1$, $0 \leq y \leq 1$, $0 \leq x+y \leq 1$).

The light-emitting element structure of a light-emitting diode has a double hetero structure in which an active layer made of a nitride semiconductor layer having a single-quantum-well structure (SQW) or a multi-quantum-well structure (MQW) is sandwiched between two cladding layers of an n-type nitride semiconductor layer and a p-type nitride semiconductor layer. When the active layer is an AlGaN-based semiconductor, by adjusting an AlN mole fraction (also referred to as an Al composition ratio), band gap energy can be adjusted within a range where band gap energies that can be taken by GaN and AlN (about 3.4 eV and about 6.2 eV) are lower and upper limits, so that an ultraviolet light-emitting element having a light emission wavelength of about 200 nm to about 365 nm is obtained. Specifically by passing a forward current from the p-type nitride semiconductor layer toward the n-type nitride semiconductor layer, light emission corresponding to the band gap energy due to recombination of carriers (electrons and holes) occurs in the active layer. In order to supply the forward current from the outside, a p-electrode is provided on the p-type nitride semiconductor layer, and an n-electrode is provided on the n-type nitride semiconductor layer.

When the active layer is an AlGaN-based semiconductor, the n-type nitride semiconductor layer and the p-type nitride semiconductor layer sandwiching the active layer are composed of the AlGaN-based semiconductor having a higher AlN mole fraction than the active layer. However, since the p-type nitride semiconductor layer of a high AlN mole fraction is difficult to form a good ohmic contact with the p-electrode, it is generally performed to form a p-type contact layer made of a p-type AlGaN semiconductor with a low AlN mole fraction (specifically p-GaN), which can have a good ohmic contact with the p-electrode, to the uppermost layer of the p-type nitride semiconductor layer. Since the AlN mole fraction of the p-type contact layer is smaller than that of the AlGaN-based semiconductor constituting the active layer, ultraviolet light emitted toward the p-type nitride semiconductor layer side from the active layer is absorbed in the p-type contact layer and cannot be effectively extracted to the outside of the element. Therefore, a typical ultraviolet light-emitting diode having an active layer made of an AlGaN-based semiconductor employs an element structure as schematically shown in FIG. 13. The ultraviolet light emitted toward the n-type nitride semiconductor layer side from the active layer is effectively extracted to the outside of the element (e.g., see Patent Documents 1 and 2, Non-Patent Documents 1 and 2, etc. listed below).

As shown in FIG. 13, the typical UV light-emitting diode is constructed by depositing an n-type AlGaN-based semiconductor layer 103, an active layer 104, a p-type AlGaN-based semiconductor layer 105, and a p-type contact layer 106 on a template 102 formed by depositing an AlGaN-based semiconductor layer 101 (e.g., AlN layer) on a substrate 100 such as a sapphire substrate, and etching away respective portions of the active layer 104, the p-type AlGaN-based semiconductor layer 105, and the p-type contact layer 106 until the n-type AlGaN-based semiconductor layer 103 is exposed, and forming an n-electrode 107 on the exposed surface of the n-type AlGaN-based semiconductor layer 103 and an p-electrode 108 on the surface of the p-type contact layer 106.

In addition, in order to improve luminous efficiency (internal quantum efficiency) by carrier recombination in the active layer, the active layer is formed in a multi-quantum-well structure, and an electron blocking layer is provided on the active layer.

On the other hand, it has been reported that in a cladding layer made of an n-type AlGaN-based semiconductor layer, compositional modulation due to segregation of Ga occurs, and stratiform regions with a locally lower AlN mole fraction are formed extending obliquely to the surface of the cladding layer (for example, see Patent Document 3, Non-Patent Documents 1, 2, etc. described below). Because the band gap energy of the AlGaN-based semiconductor layer with the locally lower AlN mole fraction is also locally reduced, it is reported in Patent Document 3 that the carriers in the cladding layer is easily localized in the stratiform regions, which can provide low resistance current paths to the active layer, and that the luminous efficiency of the ultraviolet light-emitting diode can be improved.

PRIOR ART DOCUMENTS

Patent Document

Patent Document 1: WO2014/178288
Patent Document 2: WO2016/157518
Patent Document 3: WO2019/159265

Non-Patent Document

NON-PATENT DOCUMENT 1: Y. Nagasawa, et al., "Comparison of $Al_xGa_{1-x}N$ multiple quantum wells designed for 265 and 285 nm deep-ultraviolet LEDs grown on AlN templates having macrosteps", Applied Physics Express 12, 064009 (2019)

NON-PATENT DOCUMENT 2: K. Kojima, et al., "Carrier localization structure combined with current micropaths in AlGaN quantum wells grown on an AlN template with macrosteps", Applied Physics letter 114, 011102 (2019)

SUMMARY OF THE INVENTION

Problems to be Solved by the Invention

An ultraviolet light-emitting element composed of the AlGaN-based semiconductors is produced on a substrate such as a sapphire substrate by a well-known epitaxial growth method such as, for example, a metalorganic vapor phase epitaxy (MOVPE) method. However, when producing the ultraviolet light-emitting element, the characteristics of the ultraviolet light-emitting element (properties such as emission wavelength, wall plug efficiency, forward bias, etc.) fluctuate under the influence by drift of the crystal growth apparatus, so that the producing at a stable yield is not always easy.

The drift of the crystal growth apparatus occurs due to a change in the effective temperature of the crystal growth site or the like owing to deposits on trays, chamber walls, or the like. Therefore, in order to suppress the drift, conventionally treatments such as fine adjustments of the set temperature and the composition of source gases by experienced persons with examining the growth history fixing the growth schedule for a certain period, and performing maintenance such as cleaning in the same manner for a certain period are performed, but it is difficult to eliminate the drift completely.

The present invention has been made in view of the above-mentioned problems, and an object of the present invention is to provide a nitride semiconductor ultraviolet light-emitting element which can be stably produced with variation in characteristics due to the drift of the crystal growth apparatus or the like being suppressed.

Means for Solving the Problem

The present invention, in order to achieve the above object, provides a nitride semiconductor ultraviolet light-emitting element having a peak emission wavelength within a range of 300 nm to 327 nm and comprising a light-emitting element structure part in which an n-type layer, an active layer, and a p-type layer made of an AlGaN-based semiconductor of wurtzite structure are stacked vertically, wherein
  the n-type layer is composed of an n-type AlGaN-based semiconductor,
  the active layer disposed between the n-type layer and the p-type layer has a quantum-well structure having one or more well layers composed of a GaN-based semiconductor,
  the p-type layer is composed of a p-type AlGaN-based semiconductor,
  each semiconductor layer in the n-type layer and the active layer is an epitaxially grown layer having a surface on which multi-step terraces parallel to a (0001) plane are formed,
  the n-type layer has a plurality of first Ga-rich regions, the plurality of first Ga-rich regions being stratiform regions uniformly distributed in the n-type layer with locally lower AlN mole fraction and including n-type AlGaN regions in which an AlGaN composition ratio is an integer ratio of $Al_1Ga_1N_2$,
  each extending direction of the first Ga-rich regions on a first plane perpendicular to an upper surface of the n-type layer is inclined with respect to an intersection line between the upper surface of the n-type layer and the first plane,
  an AlN mole fraction of an n-type body region outside the stratiform regions in the n-type layer is within a range of 54% to 66%.

Furthermore, the present invention, in order to achieve the above object, provides a manufacturing method of a nitride semiconductor ultraviolet light-emitting element having a peak emission wavelength within a range of 300 nm to 327 nm and comprising a light-emitting element structure part in which an n-type layer, an active layer, and a p-type layer made of an AlGaN-based semiconductor of wurtzite structure are stacked vertically the method comprising a first step of epitaxially growing the n-type layer of an n-type AlGaN-based semiconductor on an underlying part including a sapphire substrate having a main surface inclined by a predetermined angle with respect to a (0001) plane, and making multi-step terraces parallel to the (0001) plane appear on a surface of the n-type layer,
a second step of epitaxially growing the active layer of a quantum-well structure having one or more well layers composed of a GaN-based semiconductor on the n-type layer, and making multi-step terraces parallel to the (0001) plane appear on a surface of the well layer, and
a third step of forming the p-type layer of a p-type AlGaN-based semiconductor on the active layer by epitaxial growth, wherein
in the first step, a target AlN mole fraction of the n-type layer is set within a range of 54% to 66% and a plurality of first Ga-rich regions are grown so as to extend obliquely upward, the plurality of first Ga-rich regions being stratiform regions uniformly distributed in the n-type layer with locally lower AlN mole fraction and including n-type AlGaN regions in which an AlGaN composition ratio is an integer ratio of $Al_1Ga_1N_2$.

The AlGaN-based semiconductor is represented by the general formula $Al_{1-x}Ga_xN$ ($0 \leq x \leq 1$), but the semiconductor may contain a trace amount of an impurity such as a Group 3 element such as B or In or a Group 5 element such as P, as far as the band gap energy is within the lower limit and the upper limit of the band gap energy that can be obtained by GaN and AlN, respectively. The GaN-based semiconductor is basically a nitride semiconductor composed of Ga and N, and may contain a trace amount of an impurity such as a Group 3 element such as Al, B, or In or a Group 5 element such as P. The AlN-based semiconductor is basically a nitride semiconductor composed of Al and N, and may contain a trace amount of an impurity such as a Group 3 element such as Ga, B, or In or a Group 5 element such as P. Therefore, in the present application, the GaN-based semiconductor and the AlN-based semiconductor are a part of the AlGaN-based semiconductor, respectively.

Furthermore, the n-type or p-type AlGaN-based semiconductor is an AlGaN-based semiconductor in which Si or Mg or the like is doped as a donor impurity or an acceptor impurity. In the present application, the AlGaN-based semiconductor, not specified as p-type or n-type, means undoped AlGaN-based semiconductor, but even if undoped, a trace amount of donor or acceptor impurities to the extent of being inevitably mixed may be included. The first plane is not an exposed surface or a boundary surface between the n-type layer and other semiconductor layer which is specifically formed in the manufacturing process of the n-type layer but is a virtual plane extending in parallel to the vertical direction in the n-type layer. Furthermore, in this specification, an AlGaN-based semiconductor layer, a GaN-based semiconductor layer, and an AlN-based semiconductor layer are semiconductor layers composed of the AlGaN-based semiconductor, the GaN-based semiconductor, and the AlN-based semiconductor, respectively.

According to the nitride semiconductor ultraviolet light-emitting element having the above-mentioned features or the manufacturing method of the nitride semiconductor ultraviolet light-emitting element having the above-mentioned features, it is expected that a nitride semiconductor ultraviolet light-emitting element having a peak emission wavelength within a range of 300 nm to 327 nm is stably produced by primarily utilizing metastable AlGaNs formed in the first Ga-rich region in the n-type layer as described later and secondly utilizing the well layer composed of a GaN-based semiconductor to suppress the characteristics variation caused by the drift of the crystal growth apparatus or the like.

First, a "metastable AlGaN" in which an AlGaN composition ratio is represented by a predetermined integer ratio will be described.

Usually a ternary mixed crystal such as AlGaN is a crystalline state in which group 3 elements (Al and Ga) are randomly mixed and is approximately described by "random non-uniformity". However, because the covalent bond radiuses of Al and Ga are different, the higher the symmetry of the atomic arrangement of Al and Ga in the crystal structure, the more stable the structure is in general.

The AlGaN-based semiconductors with wurtzite structure can have two types of arrangements, a random arrangement without symmetry and a stable symmetric arrangement. Here, a state in which the symmetric arrangement is dominant appears at a constant rate. In the "metastable AlGaN" described later, in which an AlGaN composition ratio (composition ratio of Al, Ga, and N) is represented by a predetermined integer ratio, a periodic symmetric arrangement structure of Al and Ga develops.

In the periodic symmetric arrangement structure, even if amount of Ga supplied to the crystal growth surface is slightly increased or decreased, the mixed crystal mole fraction becomes slightly stable in terms of energy because of the high symmetry and it is possible to prevent proliferation of places where amount of easily mass-transferring Ga is extremely increased. That is, by utilizing the properties of the "metastable AlGaN" formed in the first Ga-rich region in the n-type layer, as an AlGaN-based semiconductor, even if the variation of the mixed crystal mole fraction due to the drift of the crystal growth apparatus or the like occurs, the variation of the mixed crystal mole fraction in the first Ga-rich regions which provide the low resistance current paths to the active layer as described later is locally suppressed. Consequently stable carrier supply from the n-type layer into the active layer can be realized and variation in device characteristics can be suppressed, so that it is expected to stably produce a nitride semiconductor ultraviolet light-emitting element that achieves the desired characteristics.

Next, the AlGaN composition ratio in which Al and Ga can be in the periodic symmetric arrangement in the (0001) plane will be described.

FIG. 1 shows a schematic diagram of one unit cell (two monolayers) along the c-axis of AlGaN. In FIG. 1, open circles indicate sites where atoms of Group 3 elements (Al, Ga) are located, and solid circles indicate sites where atoms of Group 5 elements (N) are located.

The site planes (A3 plane, B3 plane) of the Group 3 elements and the site planes (A5 plane, B5 plane) of the Group 5 element shown by hexagons in FIG. 1 are both parallel to the (0001) plane. Six sites at each vertex of the hexagon and one site at the center of the hexagon are present at each site of the A3 and A5 planes (collectively plane A). The same applies to the B3 plane and the B5 plane (collectively B plane), but in FIG. 1, it illustrates only three sites present in the hexagon of the B plane. Each site of the A plane is overlapped in the c-axis direction, each site of the B plane is overlapped in the c-axis direction. However, the atom (N) of one site on the B5 plane forms a quaternary bond with the atoms (Al, Ga) of the three sites on the A3 plane located above the B5 plane and the atom (Al, Ga) of one site on the B3 plane located below the B5 plane, and the atom (Al, Ga) of one site on the B3 plane forms a quaternary bond with the atom (N) of one site on the B5 plane located above the B3 plane and the atoms (N) of three sites on the A5 plane located below the B3 plane, so that each site on the A plane does not overlap each site on the B plane in the c-axis direction, as shown in FIG. 1.

FIG. 2 shows a positional relationship between each site of the A plane and the B plane, as a plan view as viewed from the c-axis direction. In both the A and B planes, each of the six vertices of the hexagon is shared by the other two hexagons adjacent to each other, and the site at the center is not shared with the other hexagons, so there are substantially three atomic sites within one hexagon. Thus, there are six sites of Group 3 element atoms (Al, Ga) and six sites of Group 5 element atoms (N) per unit cell. Therefore, the following five cases exist as AlGaN composition ratios expressed by the integer ratio excluding GaN and AlN.

1) $Al_1Ga_5N_6$
2) $Al_2Ga_4N_6$ (=$Al_1Ga_2N_3$)
3) $Al_3Ga_3N$ (=$Al_1Ga_1N_2$)
4) $Al_4Ga_2N$ (=$Al_2Ga_1N_3$)
5) $Al_5Ga_1N_6$

FIG. 3 schematically shows the A3 plane and the B3 plane of the group 3 element in the above five combinations. Ga is indicated by a solid circle, and Al is indicated by an open circle.

In the case of $Al_1Ga_5N_6$ shown in FIG. 3 (A), Ga is located at six vertex sites of the A3 plane and six vertex sites and one center site of the B3 plane, and Al is located at one center site of the A3 plane.

In the case of $Al_1Ga_2N_3$ shown in FIG. 3 (B), Ga is located at three vertex sites and one center site of the A3 and B3 planes, and Al is located at three vertex sites of the A3 and B3 planes.

In the case of $Al_1Ga_1N_2$ shown in FIG. 3 (C), Ga is located at three vertex sites and one center site of the A3 plane and three vertex sites of the B3 plane, and Al is located at three vertex sites of the A3 plane and three vertex sites and one center site of the B3 plane.

In the case of $Al_2Ga_1N_3$ shown in FIG. 3 (D), Ga is located at three vertex sites of the A3 and B3 planes, Al is located at three vertex sites and one center site of the A3 and B3 planes. This is equivalent to swapping the positions of Al and Ga in $Al_1Ga_2N_3$ shown in FIG. 3 (B).

In the case of $Al_5Ga_1N_6$ shown in FIG. 3 (E), Ga is located at one center site of the A3 plane, Al is located at six vertex sites of the A3 plane and six vertex sites and one center site of the B3 plane. This is equivalent to swapping the positions of Al and Ga in $Al_1Ga_5N_6$ shown in FIG. 3 (A).

In each of FIGS. 3(A)-3(E), assuming another hexagon whose center has moved to any one of the six vertices of the hexagon, it can be seen that Al or Ga located at the six vertex sites of the A3 plane is equivalent to Al or Ga located at the three vertex sites and the one center site of the A3 plane, and Al or Ga located at the one center of the A3 plane is equivalent to Al or Ga located at the three vertex sites of the A3 plane. The same applies to the B3 plane. In addition, in each of FIGS. 3(A), 3(C) and 3(E), A3 and B3 planes may be replaced with each other.

In each of FIGS. 3(A)-3(E), in both A3 and B3 planes, the atomic arrangement of Al and Ga is maintained in symmetry. Further, even if the center of the hexagon is moved, the atomic arrangement of Al and Ga is maintained in symmetry.

Furthermore, in the A3 and B3 planes of FIGS. 3(A)-3(E), when the hexagonal site plane is arranged repeatedly in a honeycomb shape, looking at each site in a direction parallel to the (0001) plane, for example, in [11-20] direction or [10-10] direction, the state in which Al and Ga is located periodically repeatedly or either Al or Ga is located continuously appears. Therefore, it can be seen that an atomic arrangement will be the periodic and symmetric atomic arrangement in the respective cases.

Hereinafter, $Al_{x1}Ga_{1-x1}N$ of the AlN mole fraction x1 (x1=⅙, ⅓, ½, ⅔, ⅚) corresponding to AlGaN composition ratios of above-mentioned 1) to 5) is referred to as the "first metastable AlGaN", for convenience of explanation. In the first metastable AlGaN, the atomic arrangement of Al and Ga becomes a periodic and symmetric arrangement, resulting in an energetically stable AlGaN.

Next, when the site plane indicated by the hexagon shown in FIG. 1 is extended to 2 unit cells (4 monolayers), there are two planes for each of the site planes of the Group 3 element (A3 plane, B3 plane) and two planes for each of the site planes of the Group 5 element (A5 plane, B5 plane), respectively and there are 12 sites for atoms of the Group 3 element (Al, Ga) and 12 sites for atoms of the Group 5 element (N) per 2 unit cells. Therefore, as AlGaN composition ratios expressed by the integer ratio excluding GaN and AlN, the following six combinations exist in addition to the AlGaN composition ratios of above-mentioned 1) to 5).

6) $Al_1Ga_{11}N_{12}$ (=$GaN+Al_1Ga_5N_6$)
7) $Al_3Ga_9N_{12}$ (=$Al_1Ga_3N_4$=$Al_1Ga_5N_6+Al_1Ga_2N_3$)
8) $Al_5Ga_7N_{12}$ (=$Al_1Ga_2N_3+Al_1Ga_1N_2$)
9) $Al_7Ga_5N_{12}$ (=$Al_1Ga_1N_2+Al_2Ga_1N_3$)
10) $Al_9Ga_3N_{12}$ (=$Al_3Ga_1N_4$=$Al_2Ga_1N_3+Al_5Ga_1N_6$)
11) $Al_{11}Ga_1N_{12}$ (=$Al_5Ga_1N_6+AlN$)

However, since these six AlGaN composition ratios of 6) to 11) are combinations of two AlGaN composition ratios among the first metastable AlGaN, GaN and AlN, located before and after them, the c-axis symmetry is likely to be disturbed, and the stability is lowered than the first metastable AlGaN. But these six AlGaN are more stable than AlGaN in a random asymmetric arrangement state because the symmetry of the atomic arrangement of Al and Ga in the A3 and B3 planes is the same as that in the first metastable AlGaN. Hereinafter, $Al_{x2}Ga_{1-x2}N$ of the AlN mole fraction x2 (x2=$1/12$, ¼, $5/12$, $7/12$, ¾, $11/12$) corresponding to AlGaN composition ratios of above-mentioned 6) to 11) is referred to as the "second metastable AlGaN", for convenience of explanation. As described above, the first and second metastable AlGaN have a stable structure due to the symmetry of the atomic arrangement of Al and Ga in the crystalline structure. Hereinafter, the first and second metastable AlGaN are collectively referred to as "metastable AlGaN".

To grow AlGaN with maintaining constant crystal quality it is required to perform crystal growth at a high temperature of 1000° C. or higher. However, it is assumed that Ga moves around at 1000° C. or higher even after atoms reach the sites of the crystal surface. On the other hand, since Al tends to adsorb to the surface unlike Ga, the movement after entering the site is strongly restricted though it is considered to move somewhat.

Therefore, even though $Al_1Ga_5N_6$ of above-mentioned 1), $Al_1Ga_{11}N_{12}$ of above-mentioned 6), and $Al_1Ga_3N_4$ of above-mentioned 7) are the metastable AlGaN, since AlN mole fractions are all less than or equal to 25% and Ga composition ratios are high, Ga movement is intense at a growth temperature around 1000° C., the symmetry of atomic arrangement is disturbed, and the atomic arrangement of Al and Ga is close to random condition. As a result, it is considered that the stability described above is reduced compared with other metastable AlGaN.

Next, the "first Ga-rich region" will be described. In the nitride semiconductor ultraviolet light-emitting element and the manufacturing method of the nitride semiconductor ultraviolet light-emitting element with the above-described features, since each semiconductor layer in the n-type layer and the active layer is an epitaxially grown layer having a surface on which multi-step terraces parallel to the (0001) plane are formed, in the n-type layer, the easily mass-transferring Ga moves on the terrace region and concentrates on a boundary region between adjacent terraces, thereby forming a region having a lower AlN mole fraction than the terrace region. This boundary region extends obliquely upward with respect to the (0001) plane along with the epitaxial growth of n-type AlGaN layer of the n-type layer, so that stratiform regions with locally lower AlN mole fraction are formed with uniformly dispersed in the n-type layer. Here, if the amount of Ga mass-transferring is sufficiently large, the stratiform region may be the first Ga-rich region which includes the n-type AlGaN region of the metastable AlGaN, in which the AlGaN composition ratio is $Al_1Ga_1N_2$.

Specifically, since the AlN mole fraction of the n-type body region in the n-type layer (approximated by the target AlN mole fraction of the n-type layer) is in the range of 54% to 66%, the nearest metastable AlGaN that can be included in the stratiform regions formed with the mass-transfer of Ga from the n-type body region becomes the metastable AlGaN with the AlGaN composition ratio of $Al_1Ga_1N_2$, and the difference between the AlN mole fractions of the n-type body region and the stratiform region is 5% or more. Therefore, the amount of Ga mass-transferring is sufficiently large in the most of the stratiform region, and the first Ga-rich region which includes the n-type AlGaN region of the metastable AlGaN with the AlGaN composition ratio of $Al_1Ga_1N_2$ is stably formed. Namely, the first Ga-rich regions are dominantly present in the stratiform regions, and uniformly distributed in the n-type layer as a result. However, since the crystal growth of AlGaN is a random process so that the amount of Ga mass-transferring varies randomly a region which does not include the n-type AlGaN region of the metastable AlGaN with the AlGaN composition ratio of $Al_1Ga_1N_2$, that is, a region having a locally lower AlN mole fraction which is larger than 50%, can be formed.

The metastable AlGaN, in which the AlGaN composition ratio is $Al_1Ga_1N_2$, is present within the first Ga-rich region, so that variation in amount of Ga supplied into the first Ga-rich region are absorbed in the metastable AlGaN. That is, in the first Ga-rich region, when the Ga supply amount increases, the metastable AlGaN increases, and when the Ga supply amount decreases, the metastable AlGaN decreases, and as a result, the variation of the AlN mole fraction in the first Ga-rich region is suppressed. Therefore, in the first Ga-rich region, the variation of the Ga supply amount due to the drift of the crystal growth apparatus or the like is absorbed, and the metastable AlGaN in which the AlGaN composition ratio is $Al_1Ga_1N_2$(AlN mole fraction is 50%) is stably formed. That is, the variation of the AlN mole fraction in the first Ga-rich region is suppressed against the variation of the Ga supply amount.

However, as described above, since a state of the random asymmetric arrangement and a state of the regular symmetric arrangement can usually coexist in the crystal growth of AlGaN, a region of the metastable AlGaN in the state of the regular symmetric arrangement, in which the AlN mole fraction is 50%, is stably formed in the first Ga-rich region, and a region in which the AlN mole fraction fluctuates slightly (for example, about 0 to 3%) from 50% is also mixed therein. Therefore, the AlN mole fraction in the first Ga-rich region is concentrated and distributed near the AlN-mole fraction (50%) of the metastable AlGaN in which the AlGaN composition ratio is $Al_1Ga_1N_2$.

In addition, since the AlN mole fraction of the n-type body region is in the range of 54% to 66%, the difference between the AlN mole fractions of the first Ga-rich region and the n-type body region is stably ensured to be 4% or more. Thus, the carriers in the n-type layer are localized in the first Ga-rich region having a lower band gap energy than the n-type body region, and a current can preferentially flow through the first Ga-rich region stably in the n-type layer, thereby suppressing variation in characteristics of the nitride semiconductor ultraviolet light-emitting element. As described above, since a region which does not reach the first Ga-rich region and has a locally lower AlN mole fraction which is larger than 50% can be formed, if the difference between the AlN mole fractions of this region and the n-type body region is 4% or more, the carriers in the n-type layer are also localized in this region and a current can flow through this region as well as the first Ga-rich region.

Next, the "well layer" will be described. Since each semiconductor layer in the n-type layer and the active layer is an epitaxially grown layer having a surface on which multi-step terraces parallel to the (0001) plane are formed, a boundary region between adjacent terraces of the multi-step terraces of the well layer is an inclined region inclined with respect to the (0001) plane connecting between the adjacent terraces (see Non-Patent Documents 1 and 2 above). Incidentally the inclined region consists of many steps (steps of one unit cell) and macrosteps (steps of multiple unit cells), and the (0001) surface shown stepwise on the inclined region is distinguished from the terrace surface of the multi-step terraces.

With growing of the side surfaces of the terrace edges toward lateral direction in step flow growth, a terrace on the upper surface of the well layer moves laterally relative to a terrace on the lower surface of the well layer, so that a film thickness of the well layer in the inclined region is getting thicker than that of the terrace region other than the inclined region. As a result, the band gap energy of the inclined region is smaller than that of the terrace region, and the localization of carriers is easy to occur as in the case of the first Ga-rich region of the n-type layer. For this reason, the light emission in the well layer is more remarkable in the inclined region than in the terrace region. In the above-mentioned Non-Patent Documents 1 and 2, the same content for the well layer of AlGaN-based semiconductor is reported. Incidentally while in the well layer composed of the AlGaN-based semiconductor, the compositional modulation occurs in addition to the above film-thickness modulation so that the band gap energy becomes even smaller than the terrace region, the similar localization of carriers occurs even in the well layer in which the compositional modulation does not occur. Incidentally each terrace region of the well layer and the barrier layer is a region sandwiched between the terrace on the upper surface and the terrace on the lower surface of each layer in the c-axis direction. Therefore, portion other than each terrace region of the well layer and the barrier layer is the boundary region (the inclined region) of each layer.

Furthermore, the multi-step terraces formed by epitaxial growth of the active layer are formed successively from the multi-step terraces formed by epitaxial growth of the n-type layer. Therefore, the carriers (electrons) supplied to the well layer along the current path in the first Ga-rich region are intensively supplied to the boundary region (the inclined region) between adjacent terraces where light emission is concentrated in the well layer.

Therefore, the n-type AlGaN region, which is the metastable AlGaN having an AlN mole fraction of 50%, is stably formed in the first Ga-rich region dominantly present in the stratiform region, whereby the carriers can be stably supplied to the inclined region of the well layer, and variation in characteristics such as the luminous efficiency of the nitride semiconductor ultraviolet light-emitting element can be suppressed.

Furthermore, since the upper limit of the AlN mole fraction in the n-type body region of the n-type layer and the upper limit of the target AlN mole fraction of the n-type layer are defined to be 66%, the metastable AlGaN in which the AlGaN composition ratio is $Al_2Ga_1N_3$ is not dominantly formed in the n-type layer. If the upper limit is 67% or more, the metastable AlGaN of $Al_2Ga_1N_3$ is stably formed in the n-type body region, it is getting difficult to sufficiently supply Ga from the metastable AlGaN of $Al_2Ga_1N_3$ to the first Ga-rich region to stably form the metastable AlGaN of $Al_1Ga_1N_2$, an AlN mole fraction of the n-type AlGaN-based semiconductor formed in the first Ga-rich region will be randomly varied, and the desired effect cannot be expected.

Furthermore, since the n-type layer has an AlN mole fraction of 50% or more and ultraviolet rays having a peak emission wavelength of 300 nm to 327 nm emitted at the well layer of the active layer pass through the n-type layer, the element structure for extracting the ultraviolet light-emission from the n-type layer side can be adopted.

Incidentally in order to achieve a peak emission wavelength of 300 nm to 327 nm, it is common to configure the well layer with an AlGaN-based semiconductor and adjust the AlN mole fraction, for example, within a range of less than 33%. However, in this case, since the composition ratio of Ga is large, the composition fluctuates greatly due to the segregation of Ga, and degradation of emission characteristics such as variations in emission wavelength, broadening of emission spectrum, and separation of peak wavelengths becomes a problem. It was difficult to stably achieve the desired peak emission wavelength.

However, according to the nitride semiconductor ultraviolet light-emitting element having the above-mentioned features, since the well layer is composed of the GaN-based semiconductor and there is no fluctuation of the composition due to the segregation of Ga, the variation in characteristics due to the drift of the crystal growth apparatus or the like can be suppressed. Therefore, the variation in characteristics can be suppressed in the emission wavelength as well.

Furthermore, in the nitride semiconductor ultraviolet light-emitting element of the above-described feature, it is preferable that the peak emission wavelength is set within a range of 300 nm to 327 nm with a thickness of a boundary region between adjacent terraces of the multi-step terraces of the well layer being within a range of 2 unit cells to 4 unit cells in c-axis direction and with AlN mole fractions of two AlGaN-based semiconductor layers vertically adjacent to the top and bottom of the well layer being within a range of 50% to 100%.

Furthermore, in the manufacturing method of the nitride semiconductor ultraviolet light-emitting element of the above-described feature, it is preferable that the method comprises setting a thickness of a boundary region between adjacent terraces of the multi-step terraces of the well layer within a range of 2 unit cells to 4 unit cells in c-axis direction and AlN mole fractions of two AlGaN-based semiconductor layers vertically adjacent to the top and bottom of the well layer within a range of 50% to 100% for the peak emission wavelength to be within a range of 300 nm to 327 nm, in the second step, growing the well layer, and in at least one of the first step, the second step, and the third step, growing the two AlGaN-based semiconductor layers vertically adjacent to the top and bottom of the well layer.

In these preferred implementations, the peak emission wavelength of 300 nm to 327 nm is specifically achieved with the well layer being composed of the GaN-based semiconductor.

Incidentally, the two AlGaN-based semiconductor layers vertically adjacent to the top and bottom the well layer correspond to the n-type layer and the p-type layer when the active layer is composed of only one well layer. For example, when the p-type layer is composed of multiple layers of p-type AlGaN-based semiconductors with different AlN mole fractions, the p-type AlGaN-based semiconductor layer in contact with the well layer corresponds to the p-type layer. When the active layer includes one or more well layers and a barrier layer in contact with the n-type layer side or the p-type layer side of the one or more well layers, or when the active layer includes two or more well layers and a barrier layer inserted between two adjacent well layers, the barrier layer corresponds to at least one of the two AlGaN-based semiconductor layers. Furthermore, in the case where the number of well layers is one or more, when the well layer closer to the n-type layer and the n-type layer are in contact with each other, since the n-type AlGaN regions in which the AlGaN composition ratio is an integer ratio of $Al_1Ga_1N_2$ exist in the first Ga-rich region, the condition that the AlN mole fraction is within the range of 50% to 100% is satisfied.

Incidentally, in these preferred implementations, the range of 2 unit cells to 4 unit cells in c-axis direction for the thickness of the boundary region of the well layer and the range of 50% to 100% for the AlN mole fractions of the two AlGaN-based semiconductor layers vertically adjacent to the top and bottom of the well layer indicate that the peak emission wavelength within a range of 300 nm to 327 nm can be achieved by appropriately setting the thickness of the boundary region and the AlN mole fractions of the two AlGaN-based semiconductor layers within the respective ranges, but it does not guarantee that the peak emission wavelength within the range of 300 nm to 327 nm can be achieved over the entire respective ranges. This point will be described later.

Furthermore, in the nitride semiconductor ultraviolet light-emitting element of the above-described feature, it is preferable that the active layer has a multi-quantum-well structure including two or more well layers, and that a barrier layer composed of AlGaN-based semiconductor is present between two of the well layers.

Furthermore, the manufacturing method of the nitride semiconductor ultraviolet light-emitting element of the above-described feature, in the second step, it is preferable to stack a well layer composed of a GaN-based semiconductor and a barrier layer composed of an AlGaN-based semiconductor alternately by epitaxial growth, and to form the active layer of a multi-quantum-well structure including two or more well layers, in which multi-step terraces parallel to the (0001) plane appear on each surface of the barrier layer and the well layer.

According to these preferred implementations, the active layer has a multi-quantum-well structure, and the luminous efficiency can be expected to be improved as compared with the luminous efficiency when only one well layer is used.

Furthermore, in the nitride semiconductor ultraviolet light-emitting element of the above-described feature, it is further preferable that the barrier layer is composed of an AlGaN-based semiconductor having an AlN mole fraction within a range of 50% to 90%, boundary region parts between adjacent terraces of the multi-step terraces of the barrier layer located at least on the most p-type layer side between two of the well layers has a second Ga-rich region with a locally lower AlN mole fraction within the same barrier layer.

Furthermore, in the manufacturing method of the nitride semiconductor ultraviolet light-emitting element of the above-described feature, when forming the barrier layer composed of an AlGaN-based semiconductor in the second step, it is more preferable to form a second Ga-rich region having a locally lower AlN mole fraction within the same barrier layer in boundary region parts between the terraces of the barrier layer located at least on the most p-type layer side between two of the well layers.

According to these preferred implementations, the carrier localization can occur in the second Ga-rich region of the barrier layer as well as in the first Ga-rich regions of the n-type layer. Therefore, when supplying the carriers (electrons) from the n-type layer to the boundary region (the inclined region) between the adjacent terraces in which light emission is concentrated in the well layer, it can be done efficiently through the first Ga-rich regions of the n-type layer and the second Ga-rich regions of the barrier layer.

Here, in the multi-quantum-well structure having two or more well layers, since the emission intensity is large in the well layer at the most p-type layer side, and the second Ga-rich region is formed in the barrier layer at the n-type layer side of the above-mentioned well layer, it can be done more efficiently to supply the carriers to the well layer as described above.

Furthermore, in the nitride semiconductor ultraviolet light-emitting element of the above preferred implementation, it is preferable that an AlGaN region in which an AlGaN composition ratio is an integer ratio of $Al_1Ga_1N_2$, $Al_2Ga_1N_3$, $Al_3Ga_1N_4$ or $Al_5Ga_1N_6$ exists in the second Ga-rich region of the barrier layer.

Furthermore, in the manufacturing method of the nitride semiconductor ultraviolet light-emitting element of the above preferred implementation, it is preferable in the second step, 1) to grow an AlGaN region in which an AlGaN composition ratio is an integer ratio of $Al_1Ga_1N_2$ in the second Ga-rich region by setting a target AlN mole fraction of the barrier layer within a range of 54% to 66%, or
2) to grow an AlGaN region in which an AlGaN composition ratio is an integer ratio of $Al_2Ga_1N_3$ in the second Ga-rich region by setting a target AlN mole fraction of the barrier layer within a range of 68% and 74%, or
3) to grow an AlGaN region in which an AlGaN composition ratio is an integer ratio of $Al_3Ga_1N_4$ in the second Ga-rich region by setting a target AlN mole fraction of the barrier layer within a range of 76% to 82%, or
4) to grow an AlGaN region in which an AlGaN composition ratio is an integer ratio of $Al_5Ga_1N_6$ in the second Ga-rich region by setting a target AlN mole fraction of the barrier layer within a range of 85% to 90%.

According to these preferred implementations, since the metastable AlGaN is present in the second Ga-rich region of the barrier layer, the variation of the AlN mole fraction of the second Ga-rich region is suppressed as well as the first Ga-rich region of the n-type layer and the region of the metastable AlGaN is stably formed in the second Ga-rich region. Therefore, the effects achieved by the second Ga-rich region of the barrier layer are more stably realized.

Furthermore, it is preferable that the nitride semiconductor ultraviolet light-emitting element of the above features further comprises an underlying part containing a sapphire substrate, the sapphire substrate has a main surface inclined by a predetermined angle with respect to the (0001) plane, the light-emitting element structure part is formed above the main surface, each semiconductor layer at least from the main surface of the sapphire substrate to the surface of the active layer is an epitaxially grown layer having a surface on which multi-step terraces parallel to the (0001) plane are formed.

According to the preferred implementation, a miscut sapphire substrate can be used to perform epitaxial growth such that multi-step terraces appear on the surface of each layer from the main surface of the sapphire substrate to the surface of the active layer, thereby realizing the nitride semiconductor ultraviolet light-emitting element of the above-described feature.

Effect of the Invention

According to the nitride semiconductor ultraviolet light-emitting element and the manufacturing method of the nitride semiconductor ultraviolet light-emitting element of the above-described features, it is possible to stably provide a nitride semiconductor ultraviolet light-emitting element having a peak emission wavelength within a range of 300 nm to 327 nm with the variation in characteristics due to the drift of the crystal growth apparatus or the like being suppressed.

DESCRIPTION OF EMBODIMENT

Figure 1:
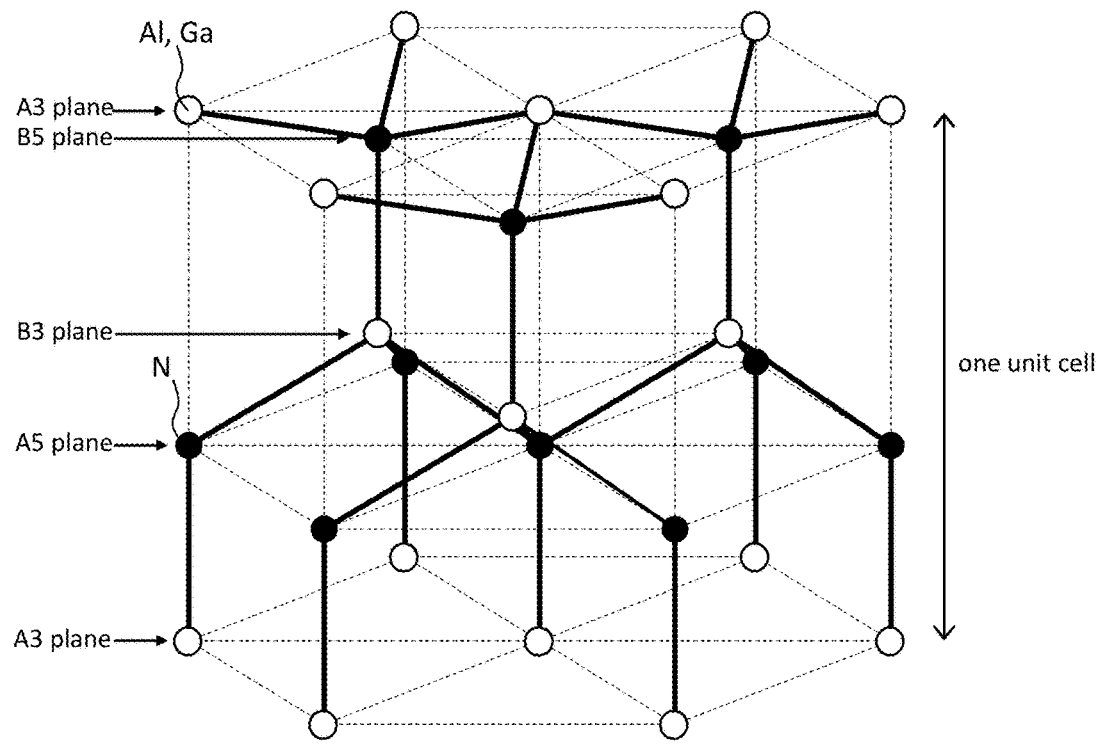
FIG. 1 is a diagram schematically illustrating the wurtzite crystal structure of AlGaN.
Figure 2:
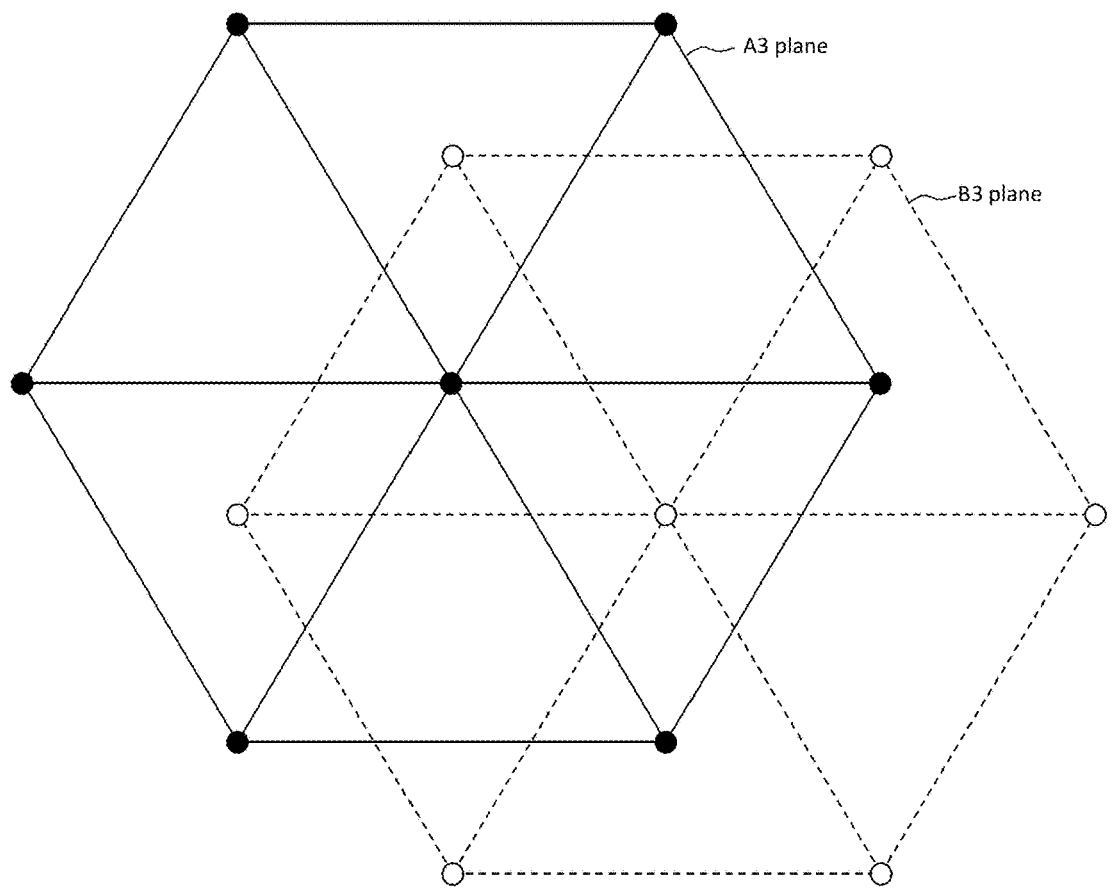
FIG. 2 is a plan view showing the positional relationship between each site of A plane and each site of B plane as viewed from the c-axis direction of the wurtzite crystal structure shown in FIG. 1.
Figure 3:
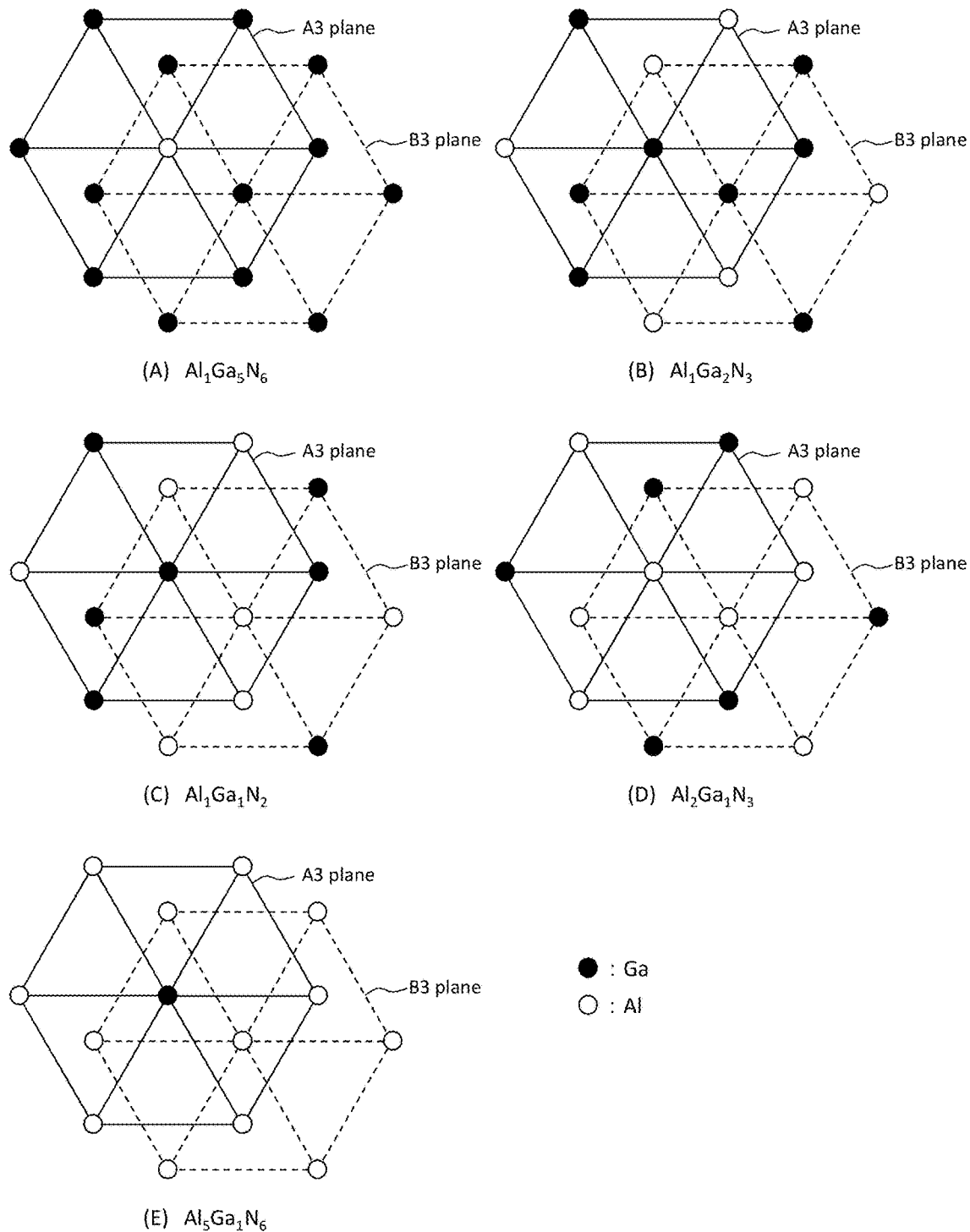
FIG. 3 is a diagram schematically showing the arrangement of Al and Ga on A3 plane and B3 plane in each of five combinations of AlGaN composition ratios represented by integer ratios.

A nitride semiconductor ultraviolet light-emitting element (hereinafter, simply referred to as a "light-emitting element") according to an embodiment of the present invention will be described with reference to the drawings. In the drawings as pattern diagram used in the following description, the dimensional ratios of each part are not necessarily the same as those of the actual elements because the essential part is emphasized to schematically show the invention for ease of understanding of the description. Hereinafter, in the present embodiment, description will be made on the assumption that the light-emitting element is a light-emitting diode.

First Embodiment

<Element Structure of Light-Emitting Element>

Figure 4:
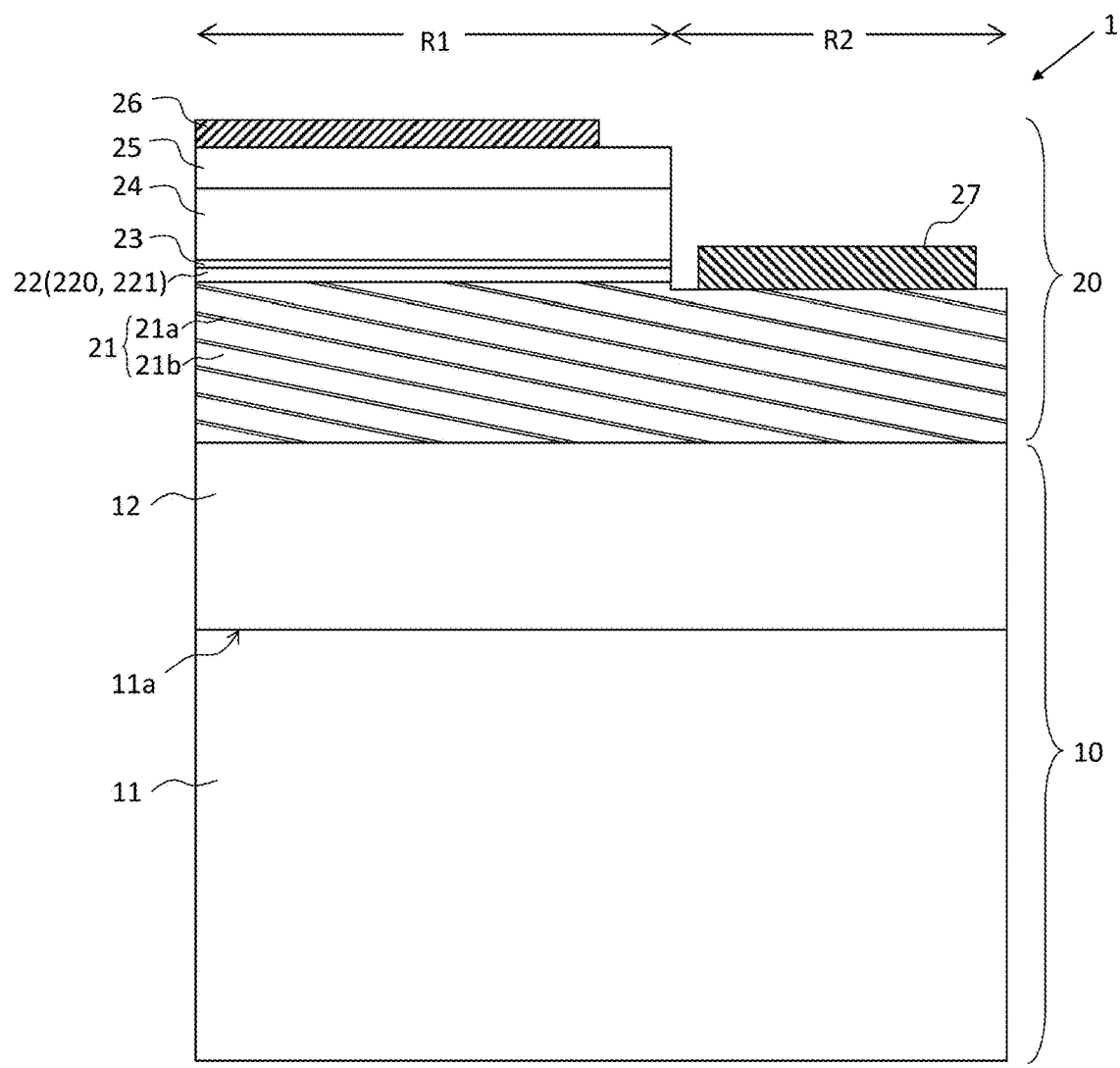
FIG. 4 is a fragmentary cross-sectional view schematically showing an exemplary configuration of a nitride semiconductor ultraviolet light-emitting element according to an embodiment of the present invention.

As shown in FIG. 4, the light-emitting element 1 of the present embodiment includes an underlying part 10 including a sapphire substrate 11, and a light-emitting element structure part 20 including a plurality of AlGaN-based semiconductor layers 21-25, a p-electrode 26, and an n-electrode 27. The nitride semiconductor light-emitting element 1 is mounted (flip-chip mounted) on a mounting base (a submount or the like) with facing a side of the light-emitting element structure part 20 (an upper side in FIG. 4) toward the mounting base, and light is extracted from a side of the underlying part 10 (a lower side in FIG. 4). In this specification, for convenience of explanation, a direction perpendicular to the main surface 11a of the sapphire substrate 11 (or the upper surface of the underlying part 10 and the respective AlGaN-based semiconductor layers 21 to 25) is referred to as "up and down direction" (or "vertical direction"), and a direction from the underlying part 10 to the light-emitting element structure part 20 is set to an upward direction and an opposite direction thereof is defined as a downward direction. A plane parallel to the vertical direction is referred to as a "first plane". A plane parallel to the main surface 11*a* of the sapphire substrate 11 (or the upper surface of the underlying part 10 and the respective AlGaN-based semiconductor layers 21 to 25) is referred to as a "second plane," and a direction parallel to the second plane is referred to as a "lateral direction."

The underlying part 10 is configured with the sapphire substrate 11 and an AlN layer 12 formed directly on the main surface 11*a* of the sapphire substrate 11. The sapphire substrate 11 is a slightly inclined substrate, in which the main surface 11*a* is inclined at an angle (miscut angle) within a certain range (e.g., from 0 degree to about 6 degrees) with respect to the (0001) plane and the multi-step terraces appear on the main surface 11*a*.

The AlN layer 12 is composed of AlN crystal epitaxially grown on the main surface of the sapphire substrate 11, the AlN crystal has an epitaxial crystal orientation relationship with respect to the main surface 11*a* of the sapphire substrate 11. Specifically for example, the AlN crystal is grown so that the C-axis direction of the sapphire substrate 11 (<0001> direction) and the C-axis direction of the AlN crystal is aligned. The AlN crystal constituting AlN layer 12 may be an AlN-based semiconductor layer which contains a trace amount of Ga or another impurity. In the present embodiment, the film thickness of the AlN layer 12 is assumed to be about 2 μm to 3 μm. The structure of the underlying part 10 and a substrate to be used are not limited to those described above. For example, an AlGaN-based semiconductor layer having an AlN mole fraction greater than or equal to the AlN mole fraction of the AlGaN-based semiconductor layer 21 may be provided between the AlN layer 12 and the AlGaN-based semiconductor layer 21.

The AlGaN-based semiconductor layers 21-25 of the light-emitting element structure part 20 comprises a structure having an n-type cladding layer 21 (n-type layer), an active layer 22, an electron blocking layer 23 (p-type layer), a p-type cladding layer 24 (p-type layer), and a p-type contact layer 25 (p-type layer) stacked in order from the underlying part 10 side by epitaxially growing them in order.

In the present embodiment, each semiconductor layer within the AlN layer 12 of the underlying part 10, the n-type cladding layer 21 and the active layer 22 of the light-emitting element structure part 20 which are epitaxially grown in order from the main surface 11*a* of the sapphire substrate 11 has a surface on which multi-step terraces parallel to the (0001) plane originating from the main surface 11*a* of the sapphire substrate 11 are formed. Since the p-type layers of the electron blocking layer 23, the p-type cladding layer 24, and the p-type contact layer 25 are formed on the active layer 22 by epitaxial growth, the same multi-step terraces can be formed, but the p-type layers do not necessarily need to have surfaces on which the same multi-step terraces are formed.

As shown in FIG. 4, in the light-emitting element structure part 20, the active layer 22, the electron blocking layer 23, the p-type cladding layer 24, and the p-type contact layer 25 are formed on the first region R1 of the upper surface of the n-type cladding layer 21 as a result of removing portions of them stacked on the second region R2 of the upper surface of the n-type cladding layer 21 by etching or the like. The upper surface of the n-type cladding layer 21 is exposed in the second region R2 except for the first region R1. The upper surface of the n-type cladding layer 21 may differ in height between the first region R1 and the second region R2, as schematically shown in FIG. 4, where the upper surface of the n-type cladding layer 21 is individually defined in the first region R1 and the second region R2.

The n-type cladding layer 21 is composed of the n-type AlGaN-based semiconductor, and stratiform regions, in which AlN mole fraction is locally lower within the n-type cladding layer 21, are present uniformly dispersed in the n-type cladding layer 21. As described above, the first Ga-rich region 21*a*, which includes the n-type AlGaN region in which the AlGaN composition ratio is an integer ratio of $Al_1Ga_1N_2$ (i.e., the n-type metastable AlGaN with an AlN mole fraction of 50%), is dominantly present in the stratiform regions. FIG. 4 schematically shows the stratiform region which is entirely the first Ga-rich region 21*a*, as examples in which the first Ga-rich region 21*a* is dominantly present in the stratiform region. The region other than the stratiform region in the n-type cladding layer 21 is referred to as an n-type body region 21*b*.

In the present embodiment, the AlN mole fraction of the n-type body region 21*b* is adjusted within a range of 54% to 66%. As the film thickness of the n-type cladding layer 21 is assumed to be about 1 μm to 2 μm, as with the film thickness adopted in the common nitride semiconductor ultraviolet light-emitting element, but the film thickness may be about 2 μm to 4 μm. In the following, for brevity purposes, the n-type AlGaN region of the metastable AlGaN, in which the AlGaN composition ratio is an integer ratio of $Al_1Ga_1N_2$, present in the first Ga-rich region 21*a* is referred to as a "metastable n-type region" for convenience. A region other than the metastable n-type region present in the first Ga-rich region 21*a*, in which the AlN mole fraction slightly fluctuates with respect to 50% (½), is referred to as a "metastable neighbor n-type region". Here, the metastable n-type region does not necessarily need to be continuously stratified in the plurality of stratiform first Ga-rich regions 21*a* and may intermittently exist separated by the metastable neighbor n-type region.

The active layer 22 has a multi-quantum-well structure in which two or more well layers 220 composed of a GaN-based semiconductor, and one or more barrier layers 221 composed of an AlGaN-based semiconductor or an AlN-based semiconductor are stacked alternately. The barrier layer 221 is not necessarily provided between the lowermost well layer 220 and the n-type cladding layer 21. In addition, the barrier layer 221 or a layer of AlGaN or AlN having a thinner thickness and a higher AlN mole fraction than the barrier layer 221 may be provided between the uppermost well layer 220 and the electron blocking layer 23.

Figure 5:
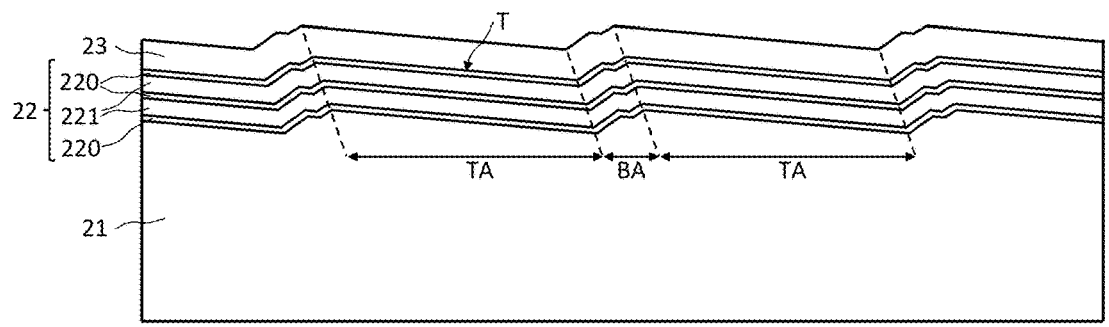
FIG. 5 is a fragmentary cross-sectional view schematically showing an exemplary laminated structure of an active layer of the nitride semiconductor ultraviolet light-emitting element shown in FIG. 1.

FIG. 5 schematically shows an exemplary laminated structure of the well layer 220 and the barrier layer 221 in the active layer 22. FIG. 5 illustrates an example for three well layers 220. The structure in which the terrace T in the well layer 220 and the barrier layer 221 shown in FIG. 5 grows in multi-steps is a known structure as disclosed in Non-Patent Documents 1 and 2 described above. The boundary region BA between the adjacent terraces T has an inclined region inclined with respect to the (0001) plane as described above. In the present embodiment, the tread (distance between adjacent boundary regions BA) of one terrace T is assumed to be several tens nm to several hundreds nm.

In the present embodiment, in order to make a peak emission wavelength of an ultraviolet light-emission from the well layer 220 within a range of 300 nm to 327 nm, a thickness of a boundary region between adjacent terraces of the multi-step terraces of the well layer is adjusted within a range of 2 unit cells to 4 unit cells in c-axis direction and an AlN mole fraction of the barrier layer is adjusted within a range of 50% to 100%.

Figure 6:
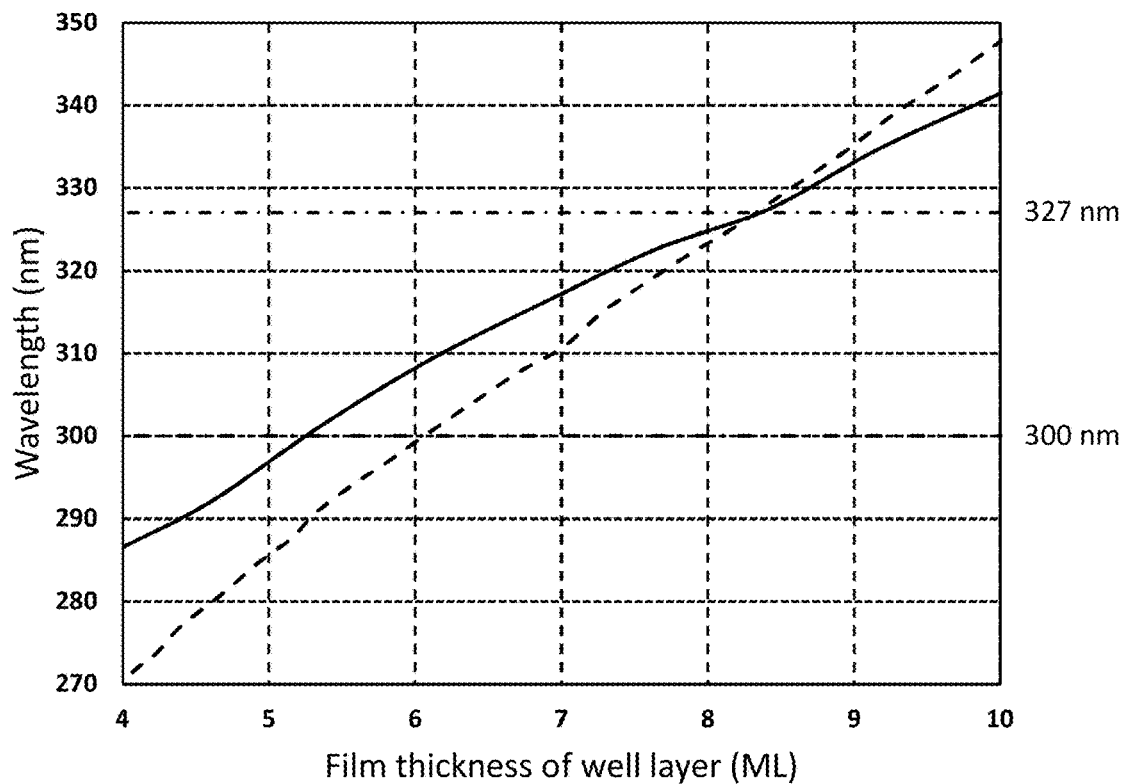
FIG. 6 is a graph showing the relationship between the emission wavelength of the quantum-well structure consisting of GaN well layer and AlGaN barrier layer, the film thickness of the well layer, and the AlN mole fraction of the barrier layer.

FIG. 6 is a graphical representation of the simulated emission wavelengths (corresponding to the peak emission wavelengths) for the quantum-well structure model, in which the well layer is composed of GaN and the barrier layer is composed of AlGaN or AlN, obtained by changing the film thickness of the well layer within a range of 4 ML (monolayer) to 10 ML and setting the AlN mole fraction of the barrier layer to 66.7% (AlGaN) and 100% (AlN).

From FIG. 6, the quantum confinement effect in the well layer is increased and the emission wavelength is shortened as the AlN mole fraction of the barrier layer 221 is increased and the film thickness of the well layer 220 is decreased within a range of 4 ML to 8 ML (2 unit cells to 4 unit cells). It can also be seen that within the above ranges, the emission wavelength varies approximately in a range of 270 nm to 325 nm. Furthermore, If the emission wavelength is desired to be 327 nm slightly longer than 325 nm, it can be achieved by making the AlN mole fraction of the barrier layer slightly smaller than 66.7%. It can be seen from FIG. 6 that the emission wavelength within the range of 300 nm to 327 nm can be achieved by adjusting the thickness of the inclined region of the well layer within a range of 2 unit cells to 4 unit cells and the AlN mole fraction of the barrier layer within a range of 50% to 100%.

Since the ultraviolet light emission in the well layer 220 is remarkably generated in the boundary region (the inclined region) BA, it is essential that the film thickness condition of the well layer 220 is satisfied in the inclined region BA. The film thickness of the terrace region TA of the well layer 220 is preferably adjusted within the range of 2 unit cells to 4 unit cells as in the case of the inclined region BA, but may partially exceed 4 unit cells due to a hexagonal minute projection (hillock) or the like which may exist on a part of the terrace T. It is preferable to adjust the film thickness of the barrier layer 221, including the terrace region TA and the inclined region BA, within a range of 6 nm to 8 nm, for example.

As described above, the barrier layer 221 has a surface on which multi-step terraces T parallel to the (0001) plane are formed as with the n-type cladding layer 21 and the well layer 220 and is composed of an AlGaN-based semiconductor as with the n-type cladding layer 21. Here, the barrier layer 221 may be composed of an AlGaN-based semiconductor in which the AlN mole fraction is not 100% in accordance with the peak emission wavelength and the film thickness of the inclined region in the well layer 220, although the barrier layer 221 may be composed of an AlN-based semiconductor in which the AlN mole fraction is 100%. Therefore, as schematically shown in FIG. 5, when the barrier layer 221 is composed of an AlGaN-based semiconductor in which AlN mole fraction is not 100%, the second Ga-rich region 221*a* having a locally lower AlN mole fraction in the barrier layer 221 can be formed in the boundary region (the inclined region) BA between the adjacent terraces T of the barrier layer 221 or its vicinity, similarly to the n-type cladding layer 21. A region other than the second Ga-rich region 221*a* in the barrier layer 221 is referred to as a barrier body region 221*b* for convenience. The barrier body region 221*b* mainly exists in the terrace region TA in the barrier layer 221. If the AlN mole fraction of the entire barrier layer 221 including the second Ga-rich region 221*a* is, as an example, in a range of 50% to 90%, which is a part of the above-mentioned range of 50% to 100%, it is preferable that the AlN mole fraction difference between the second Ga-rich region 221*a* and the barrier body region 221*b* is 4% to 5% or more in order to sufficiently secure the effect of the carrier localization in the second Ga-rich region 221*a*, but the effect of the carrier localization can be expected even if the AlN mole fraction difference is about 1%. Therefore, in this embodiment, the AlN mole fraction of the barrier body region 221*b* is set within a range of 51% to 90%

The electron blocking layer 23 is composed of a p-type AlGaN-based semiconductor. The p-type cladding layer 24 is composed of a p-type AlGaN-based semiconductor. The p-type contact layer 25 is composed of a p-type AlGaN-based semiconductor or p-type GaN based semiconductor. The p-type contact layer 25 is typically composed of GaN. The thicknesses of the respective layers such as the active layer 22, the electron blocking layer 23, the p-type cladding layer 24, and the p-type contact layer 25 are appropriately determined in accordance with the emission wavelength characteristics and the electric characteristics of the light-emitting element 1. The p-type cladding layer 24 may be omitted in order to reduce the parasitic resistance of the p-type layers.

Figure 7:
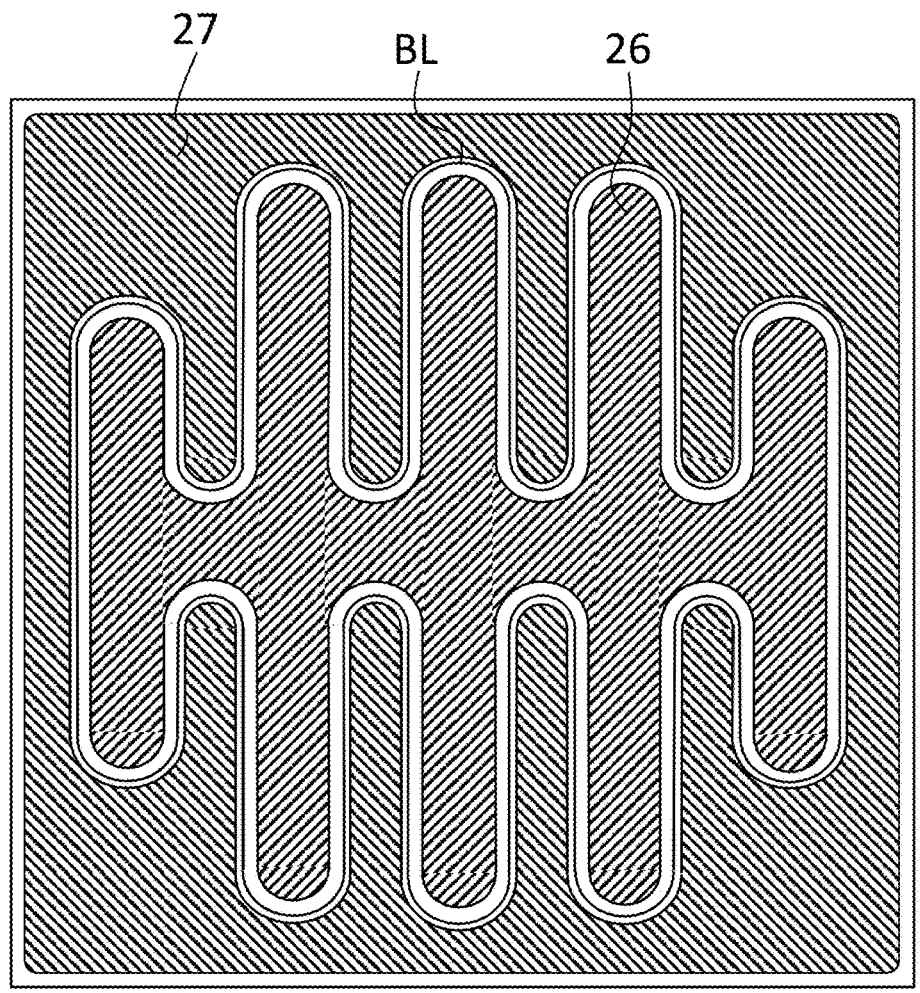
FIG. 7 is a plan view schematically showing an exemplary structure when the nitride semiconductor ultraviolet light-emitting element shown in FIG. 4 is viewed from the upper side of FIG. 4.

The p-electrode 26 is made of, for example, a multilayer metal film such as Ni/Au, and is formed on the upper surface of the p-type contact layer 25. The n-electrode 27 is made of, for example, a multilayer metal film such as Ti/Al/Ti/Au and is formed on a part of the exposed surface of the n-type cladding layer 21 in second region R2. The p-electrode 26 and the n-electrode 27 are not limited to the multilayer metal film described above, and the electrode structure such as the metal constituting each electrode, the number of layers, and the stacking order of layers may be changed as appropriate. FIG. 7 shows an example of shapes of the p-electrode 26 and the n-electrode 27 viewed from the upper side of the light-emitting elements 1. In FIG. 7, a line BL existing between the p-electrode 26 and the n-electrode 27 represents a boundary line between the first region R1 and the second region R2 and coincides with the outer peripheral side wall surfaces of the active layer 22, the electron blocking layer 23, the p-type cladding layer 24, and the p-type contact layer 25.

Although in the present embodiment, as shown in FIG. 7, a comb-like shape is employed as an example of the planarly-viewed shapes of the first region R1 and the p-electrode 26, the planarly-viewed shapes and arrangements of the first region R1 and the p-electrode 26 are not limited to the illustration shown in FIG. 7.

When a forward bias is applied between the p-electrode 26 and the n-electrode 27, holes are supplied from the p-electrode 26 toward the active layer 22, electrons are supplied from the n-electrode 27 toward the active layer 22, and the supplied holes and electrons respectively reach the active layer 22 and recombine to emit light. This also causes a forward current to flow between the p-electrode 26 and the n-electrode 27.

As to the first Ga-rich region 21*a* of the n-type cladding layer 21, as shown schematically by a double line in FIG. 4, a plurality of layers is vertically separated from each other. Furthermore, in one first plane (for example, the cross section shown in FIG. 4) which is parallel to the vertical direction, at least a part of the extending direction of the first Ga-rich region 21*a* is inclined with respect to the lateral direction (the extending direction of an intersection line of the first plane and the second plane). In the first plane shown in FIG. 4, each layer of the first Ga-rich regions 21*a* is schematically illustrated by a parallel line (double line), the inclination angle θ formed between the extending direction and the lateral direction is not necessarily the same between the first Ga-rich regions 21a, and may vary depending on the position even within the same first Ga-rich region 21a, so that the first Ga-rich region 21a on the first plane do not necessarily extend linearly. Furthermore, the inclination angle θ is also changed by the orientation of the first plane. Therefore, a part of the first Ga-rich region 21a may intersect with or diverge from another first Ga-rich region 21a on the first plane. It is clearly indicated in HAADF-STEM image shown in FIG. 8 that the inclination angle formed between the extending direction and the lateral direction of the first Ga-rich region 21a varies depending on the position, and that the first Ga-rich region 21a is uniformly dispersed in the n-type cladding layer 21.

The first Ga-rich region 21a is shown as one line (double line) on the first plane in FIG. 4, but also extends in a direction perpendicular to the first plane in a direction parallel or inclined to the second plane and has a two-dimensional extension. Accordingly the plurality of first Ga-rich regions 21a can be observed in stripes on the plurality of second planes in the n-type cladding layer 21.

The first Ga-rich region 21a is a stratiform region with locally lower AlN mole fraction in the n-type cladding layer 21, as described above. That is, the AlN mole fraction of the first Ga-rich region 21a is relatively low with respect to the AlN mole fraction of the n-type body region 21b. In addition, when the AlN mole fractions of both regions are asymptotically consecutive in the vicinity of the boundary between the first Ga-rich region 21a and the n-type body region 21b, the boundary between both regions cannot be clearly defined.

Therefore, in such cases, a portion in which the AlN mole fraction is lower than a reference value can be relatively defined as the first Ga-rich region 21a, assuming that the reference value is the average AlN mole fraction of the entire n-type cladding layer 21, for example, the AlN mole fraction serving as a basis for the growth condition of the n-type cladding layer 21 (supply amount and flow rate of the source gases and the carrier gas used in the metalorganic vapor phase epitaxy method), which will be described later. In addition to the above-mentioned defining methods, for example, based on a HAADF-STEM image to be described later, a portion having a large brightness change may be defined as the boundary between both layers. However, in the present invention, the definition of the boundary between both layers is not significant, and it is sufficient if the presence of the first Ga-rich region 21a itself can be grasped.

Indeed, since the first Ga-rich region 21a is formed with the mass-transfer of Ga from the n-type body region 21b, the average AlN mole fraction in the first Ga-rich region 21a varies depending on the amount of Ga supplied from the n-type body region 21b, and the AlN mole fraction is not necessarily uniform even in the first Ga-rich region 21a. However, in the present embodiment, since the metastable n-type region is stably formed in the first Ga-rich region 21a, even if there is a small variation in the above Ga supply amount, the variation is absorbed by the metastable n-type region, and the variation of the AlN mole fraction in the first Ga-rich region 21a is suppressed. Therefore, the minimum value of the AlN mole fraction in each of the first Ga-rich regions 21a is 50%, which is the AlN mole fraction of the metastable n-type regions, or a value in the vicinity thereof. However, as described above, the metastable neighbor n-type region also exists together with the metastable n-type region in the first Ga-rich region 21a. Since the metastable neighbor n-type region is also formed with the mass-transfer of Ga from the n-type body region 21b, usually the AlN mole fraction of the metastable neighbor n-type region is higher than the AlN mole fraction of the metastable n-type region, and the average AlN mole fraction in the first Ga-rich region 21a is slightly higher than the AlN mole fraction of the metastable n-type region.

On the other hand, in the n-type body region 21b, Ga is supplied to the first Ga-rich region 21a, so that the AlN mole fraction is relatively high at a portion in the n-type body region 21b where Ga has been mass-transferred. Furthermore, the mass-transfer of Ga that does not lead to the formation of the first Ga-rich region 21a may also occur in the n-type body region 21b, so that the AlN mole fraction also varies to some extent in the n-type body region 21b. However, as described above, since the carriers in the n-type cladding layer 21 is localized in the first Ga-rich region 21a with smaller band gap energy than the n-type body region 21b, and in the n-type cladding layer 21, the current flows stably preferentially in the first Ga-rich region 21a, even if the AlN mole fraction in the n-type body region 21b varies slightly the characteristics variation of the light-emitting element 1 is suppressed by the first Ga-rich region 21a.

<Method for Manufacturing Light-Emitting Element>

Next, an example of a manufacturing method of the light-emitting element 1 illustrated in FIG. 4 will be described.

First, by a well-known epitaxial growth method such as metalorganic vapor phase epitaxy (MOVPE) method, the AlN layer 12 contained in underlying part 10 and the nitride semiconductor layers 21 to 25 contained in the light-emitting element structure part 20 are epitaxially grown on the sapphire substrate 11 sequentially and laminated. At this time, for example, Si is doped into the n-type cladding layer 21 as a donor impurity and Mg is doped into the electron blocking layer 23, the p-type cladding layer 24, and the p-type contact layer 25 as an acceptor impurity.

In the present embodiment, in order to make multi-step terraces parallel to the (0001) plane on at least the AlN layers 12, the n-type cladding layer 21, and the active layer 22 (the well layer 220, the barrier layer 221), a slightly inclined substrate is used as the sapphire substrate 11, in which the main surface 11a is inclined at an angle (miscut angle) within a certain range (for example, from 0 degree to about 6 degrees) with respect to the (0001) plane, and the multi-step terraces appear on the main surface 11a.

As a condition of such epitaxial growth, in addition to the use of the slightly inclined (0001) sapphire substrate 11, for example, growth rate in which the multi-step terraces easily appear (specifically for example, the growth rate achieved by appropriately setting various conditions such as growth temperature, supply amount and flow rate of the source gas and the carrier gas) and the like are included. Note that these various conditions may differ depending on the type and structure of the film forming apparatus, and therefore, it is good to actually make some samples in the film forming apparatus in order to specify these conditions.

As growth conditions of the n-type cladding layer 21, a growth temperature, a growth pressure, and a donor impurity concentration are selected so that the growth start points of the first Ga-rich region 21a are formed on the step portions (boundary region) between the multi-step terraces formed on the upper surface of the AlN layer 12 by the mass transfer of Ga immediately after the growth start, and the first Ga-rich region 21a can grow obliquely upward by the segregation due to the mass transfer of Ga in accordance with the epitaxial growth of the n-type cladding layer 21 (the base layer 21a).

Specifically the growth temperature is preferably 1050° C. or higher at which the mass transfer of Ga easily occurs, and the growth temperature is preferably 1150° C. or lower at which a good n-type AlGaN can be prepared. Furthermore, when the growth temperature exceeds 1170° C., the mass-transfer of Ga becomes excessive, and the AlN mole fraction tends to vary randomly even in the first metastable AlGaN. Therefore, such a high growth temperature exceeding 1170° C. is not preferable since it is difficult to form stably the metastable AlGaN in which the AlN mole fraction is 50%. The growth pressure of 75 Torr or less is preferable as the growth condition of a good AlGaN, and the growth pressure of 10 Torr or more is practical as the control limit of the film forming apparatus. The donor impurity density is preferably about $1 \times 10^{18}$ to $5 \times 10^{18}$ cm$^{-3}$. The above-described growth temperature, growth pressure, and the like are examples, and the optimum conditions may be appropriately specified according to the film forming apparatus to be used.

The supply amount and the flow rate of the source gases (trimethylaluminum (TMA) gas, trimethylgallium (TMG) gas, and ammonia gas) and the carrier gas used in the metalorganic vapor phase epitaxy method are set according to the average AlN mole fraction Xa of the entire n-type cladding layer 21 as a target value. Here, assuming that the average AlN mole fraction of the n-type body region 21b is Xb (=54% to 66%), and the average AlN mole fraction of the first Ga-rich region 21a, in which the metastable n-type region having the AlN mole fraction of 50% and the metastable neighbor n-type region having the AlN mole fraction slightly higher than 50%, is Xc (>50%), and considering the mass-transfer of Ga from the n-type body region 21b to the first Ga-rich region 21a, Xb>Xa>Xc. However, since the volume ratio of the first Ga-rich region 21a to the entire n-type cladding layer 21 is small, it can be approximately set as Xa=Xb.

In the first Ga-rich region 21a, the metastable n-type region having the AlN mole fraction of 50% is stably present, and since the target value Xa of the AlN mole fraction of the n-type cladding layer 21 is 54% to 66%, the difference between the AlN mole fraction of 50% in the metastable n-type region and the average AlN mole fraction Xb of the n-type body region 21b (Xb-50%) is stably 4% or more, and the carriers in the n-type layer are localized in the first Ga-rich region 21a having a smaller bandgap energy than the n-type body region 21b. Furthermore, since the upper limit of the target value Xa is 66%, the metastable AlGaN in which the AlGaN composition ratio is $Al_2Ga_1N_3$ is not dominantly formed in the n-type body region 21b. If the upper limit of the target value Xa is 67% or more, the metastable AlGaN of $Al_2Ga_1N_3$ is stably formed in the n-type body region 21b, and it is difficult to fully supply Ga from the metastable AlGaN of $Al_2Ga_1N_3$ in order to stably form the metastable AlGaN (the metastable n-type region) of $Al_1Ga_1N_2$ in the first Ga-rich region. Therefore, the metastable n-type region having the AlN mole fraction of 50% can be stably formed in the first Ga-rich region 21a by setting the upper limit of the target value Xa to 66%.

Note that the donor impurity concentration does not necessarily have to be uniformly controlled in the vertical direction with respect to the film thickness of the n-type cladding layer 21. For example, there may be a low impurity concentration layer in which the impurity concentration of a predetermined thin film thickness portion in the n-type cladding layer 21 is lower than the above-mentioned set concentration, and is controlled to be, for example, less than $1 \times 10^{18}$ cm$^{-3}$, more preferably $1 \times 10^{17}$ cm$^{-3}$ or less. As the film thickness of the low impurity concentration layer, it is preferably about larger than 0 nm and 200 nm or less, more preferably about 10 nm or more and 100 nm or less, and still more preferably about 20 nm or more and 50 nm or less. Furthermore, the donor impurity concentration of the low impurity concentration layer may be lower than the set concentration, and an undoped layer (0 cm$^{-3}$) may be partially included. Furthermore, it is preferable that a part of or all the low-impurity-concentration layer is present in the upper layer region having a depth of 100 nm or less at lower side from the upper surface of the n-type cladding layer 21.

As described above, when the n-type cladding layer 21 having the first Ga-rich region 21a and the n-type body region 21b is formed, the active layer 22 (the well layer 220, the barrier layer 221), the electron blocking layer 23, the p-type cladding layer 24, the p-type contact layer 25, and the like are subsequently formed on the entire upper surface of the n-type cladding layer 21 by a well-known epitaxial growth method such as a metalorganic vapor phase epitaxy (MOVPE) method.

In forming the active layer 22, under the growth conditions in which the above-described multi-step terraces easily appear, the well layer 220 is grown without supplying the TMA gas so that the film thickness of the well layer 220 is the thickness predetermined within the range of 2 unit cells to 4 unit cells in order to achieve a peak emission wavelength of the ultraviolet light emission within the range of 300 nm to 327 nm. The barrier layer 221 is grown using the AlN mole fraction (51% to 90% or 100%) set for the barrier body region 221b as a target value under the growth conditions in which the above-described multi-step terraces easily appear in the same manner as in the n-type cladding layer 21.

Next, by a well-known etching method such as reactive ion etching, the second region R2 of the nitride semiconductor layers 21 to 25 stacked in the above manner is selectively etched until the upper surface of the n-type cladding layer 21 is exposed. As a result, the second region R2 part of the upper surface of the n-type cladding layer 21 is exposed. Then, the p-electrode 26 is formed on the p-type contact layer 25 in the unetched first region R1 and the n-electrode 27 is formed on the n-type cladding layer 21 in the etched second region R2 by a well-known deposition method such as an electron-beam evaporation method. After at least one of the p-electrode 26 and the n-electrode 27 is formed, heat treatment may be performed by a well-known heat treatment method such as RTA (rapid thermal annealing).

Note that, as an example, the light-emitting element 1 can be used in a state in which it is flip-chip mounted on a base such as a submount and then sealed by a predetermined resin such as a silicone resin or an amorphous fluororesin (e.g., a resin having a lens shape)

<Cross-Sectional Observation and Compositional Analyses of n-Type Cladding Layer>

Next, a sample for observing the cross section of the n-type cladding layer 21 is produced, a sample piece having a cross section perpendicular (or substantially perpendicular) to the upper surface of the n-type cladding layer 21 is processed by a focused ion beam (FIB), and the sample piece is observed by a scanning transmission electron microscope (STEM), and the result will be described with reference to the drawings.

The sample was produced by sequentially depositing the n-type cladding layer 21, the active layer 22, an AlGaN layer having a higher AlN mole fraction than the n-type cladding layer 21, an AlGaN layer for protecting the sample surfaces, and a protective resin film on the underlying part 10 composed of the sapphire substrate 11 and the AlN layer 12 in accordance with the manufacturing procedure of the n-type cladding layer 21 and the like described above. In the preparation of the sample, the underlying part 10 in which multi-step terraces were appeared on the surface of the AlN layer 12 using the sapphire substrate 11 whose main surface has a miscut angle with respect to the (0001) plane was used. In the preparation of the sample, the film thickness of the n-type cladding layer 21 was set to 2 μm, and the target AlN mole fraction of the n-type cladding layer 21 was set to 58%. In addition, the dose of donor impurity (Si) was controlled so that the donor impurity concentration was about $3\times10^{18}$ cm$^{-3}$.

Figure 8:
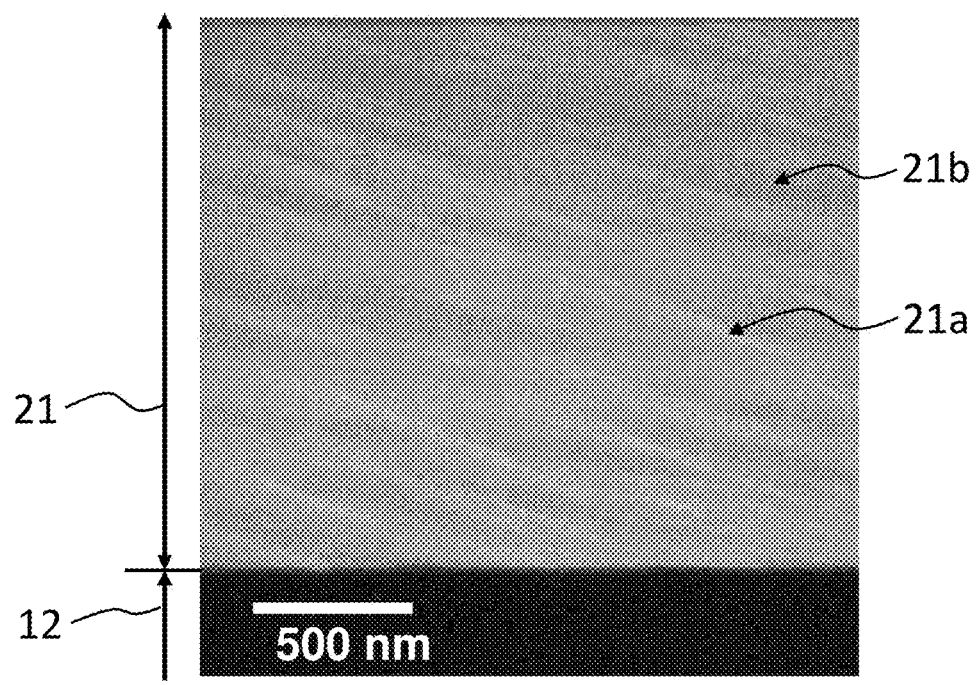
FIG. 8 is a HAADF-STEM image showing the cross-sectional construction in the n-type cladding layer.

FIG. 8 shows the high-angle annular dark-field (HAADF)-STEM image of the cross section of the sample piece. FIG. 8 is a HAADF-STEM image of the entire n-type cladding layer 21 including a part of the sample piece from the upper layer of the AlN layer 12 to the upper surface of the n-type cladding layer 21.

In HAADF-STEM image, contrasts proportional to atomic weights are obtained, and heavy elements are displayed brightly. Therefore, as to the first Ga-rich region 21a and the n-type body region 21b in the n-type cladding layer 21, the first Ga-rich region 21a having lower AlN mole fraction are displayed brighter than the n-type body region 21b. HAADF-STEM image is more suitable for observing differences in AlN mole fraction than the normal STEM image (bright-field image).

It can be seen from FIG. 8 that a plurality of the first Ga-rich regions 21a, which are stratiform regions having locally lower AlN mole fraction, are present dispersed in the vertical direction in the n-type cladding layer 21, and each of the first Ga-rich regions 21a is extending in a direction inclined with respect to the intersection line between the upper surface of the n-type cladding layer 21 and the first plane on a viewing surface of the HAADF-STEM image (a cross section of the sample piece, corresponding to the first plane). Although each of the first Ga-rich regions 21a is extending obliquely upward in a linear manner, it is not necessarily extending in a straight line, and the inclination angle with respect to the intersection varies by location even in the same first Ga-rich region 21a. On the cross section shown in FIG. 8 (corresponding to the first plane), it is also observed that a portion of the first Ga-rich region 21a intersects with or branches from another first Ga-rich region 21a.

In the present embodiment, the compositional analyses in the n-type cladding layer 21 of the sample pieces were performed by two types of analysis methods (line analysis of energy dispersive X-ray spectroscopy (cross-sectional TEM-EDX) and CL (cathodoluminescence) method).

In the compositional analysis by EDX method (EDX measurement), an electron beam probe (diameter: about 2 nm) was scanned first longitudinally (vertical direction) and laterally (direction parallel to the second plane) in the entire measurement region covering substantially the entire area of HAADF-STEM image shown in FIG. 8, and the detection data (X-ray intensity corresponding to the respective Al and Ga compositions) at each probe location distributed in a matrix of 512×512 at about 4 nm intervals in the longitudinal and transverse directions, was obtained.

Figure 9:
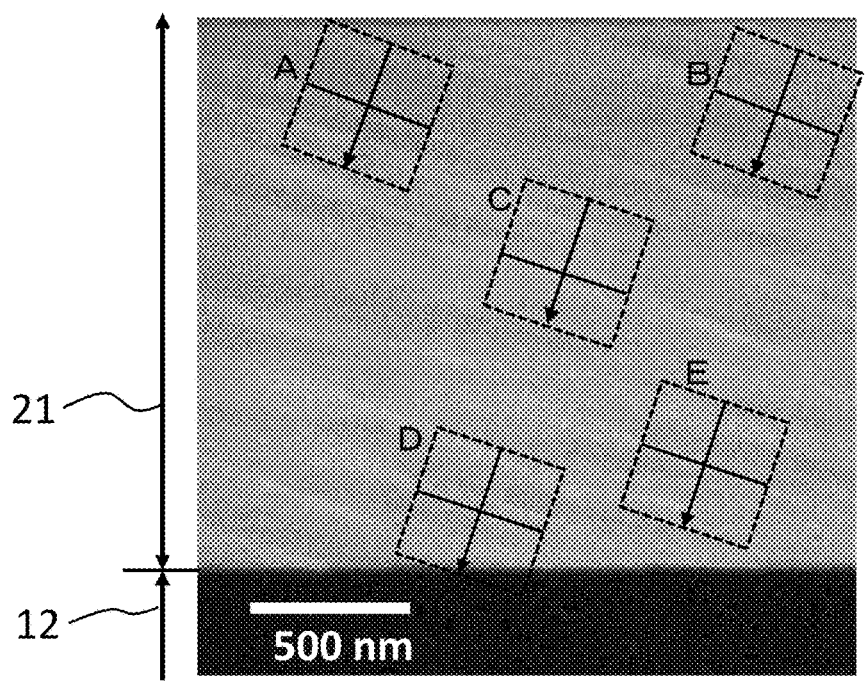
FIG. 9 is a diagram illustrating five measurement regions A to E in which line-analysis of the cross-sectional TEM-EDX in the n-type cladding layer is performed, in the HAADF-STEM image shown in FIG. 8.

Next, in order to perform the line-analysis by the EDX measurement to the first Ga-rich region 21a dispersed in the entire measurement region, five measurement regions A to E having a generally square shape (about 420 nm×about 420 nm) were set in the entire measurement region as shown in FIG. 9. FIG. 9 shows a rectangular frame representing respective measurement regions A to E superimposed on HAADF-STEM image of FIG. 8. Each of the five measurement regions is set so that at least one of the first Ga-rich regions 21a confirmed on HAADF-STEM image is crossing in each measurement region. The inclination of each measurement region is set for each measurement region so that the extending direction of at least one of the first Ga-rich regions 21a in the measurement region is perpendicular to the scanning direction of the line analysis. Each inclination of the measurement regions A to E (the angle between the longitudinal direction of the entire measurement region and the longitudinal direction of each measurement region) is approximately equal at about 20°, but strictly speaking, is not necessarily the same. Here, for convenience of explanation, the scanning direction of the line analysis is defined as a longitudinal direction and the direction perpendicular to the scanning direction is defined as a transverse direction in each of the measurement regions A to E of FIG. 9, apart from the longitudinal and transverse directions of the entire measurement region. The center vertical line shown in each of the measurement regions indicates the scanning direction, and the center horizontal line indicates the position where said at least one of the first Ga-rich regions 21a is assumed to be present and is the origin (0 nm) of the scanning position of the line analysis in the compositional analysis described later. Incidentally the vertical line indicating the scanning direction is marked with an arrow, which points to the direction of the AlN layer 12. The scanning positions are set on the center vertical line in the longitudinal direction across the above-mentioned origin at intervals of about 5 nm and within the range of 49 to 88 points in total for each measurement region A to E.

In the EDX measurement, since the diameter of the electron beam probe to be irradiated is as small as about 2 nm, the spatial resolution is high, but since the X-rays emitted from respective probe positions are weak, in the line analysis of the present embodiment, respective detection data obtained from a plurality of probe positions aligned in the transverse direction at each scanning position are accumulated to be the detection data at each scanning position. Incidentally, "aligned in the transverse direction" means that the irradiation range of the electron beam probe is overlapped with the horizontal line intersecting the vertical line and extending in the transverse direction at each scanning position.

Therefore, when all the plurality of probe positions aligned in the transverse direction are located within the metastable n-type region of the first Ga-rich region 21a at a certain scanning position, the accumulated detection data accurately indicates the AlN mole fraction of the metastable n-type region. Similarly, when all the plurality of probe positions aligned in the transverse direction are located within the n-type body region 21b at a certain scanning position, the accumulated detection data accurately indicates the AlN mole fraction of the n-type body region 21b.

However, at a certain scanning position, when a part of the plurality of probe positions aligned in the transverse direction, or a part of the probe range (about 2 nm in diameter) of each probe position is located within the metastable neighbor n-type region or the n-type body region 21b other than the metastable n-type region, due to the extending direction of the metastable n-type region of the first Ga-rich region 21a being not exactly perpendicular to the scanning direction of the line analysis, or the extending direction of the metastable n-type region of the first Ga-rich region 21a being not straight such as by bending, or the like, the accumulated detection data indicates an average AlN mole fraction of the plurality of probe positions, and indicates a value higher than the AlN mole fraction of the metastable n-type region.

Similarly, even if most of the plurality of probe positions aligned in the transverse direction are located within the n-type body region 21b at a certain scanning position, when a part of the plurality of probe positions or a part of the probe range (about 2 nm in diameter) of each probe position is located in a region having locally lower or higher AlN mole fraction caused by the mass-transfer in the n-type body region 21b, or in a region having locally lower AlN mole fraction other than the n-type body region 21b (a stratiform region other than the first Ga-rich region 21a, the metastable n-type region or the metastable neighbor n-type region in the first Ga-rich region 21a), the accumulated detection data indicates an average AlN mole fraction of the plurality of probe positions, and indicates a value lower or higher than the average AlN mole fraction of the n-type body region 21b (z target value of the AlN mole fraction of the n-type cladding layer 21).

FIG. 10A to FIG. 10E show the results of compositional analyses in the n-type cladding layer 21 in the five measurement regions A to E shown in FIG. 9 by the linear analysis of the EDX measurement. In the graphs of the compositional analysis results of the measurement regions A to E shown in FIGS. 10A to 10E, the horizontal axis indicates the scanning position along the center vertical line of each measurement region, and the vertical axis indicates the measurement results of the AlN mole fraction and the GaN mole fraction. 0 nm of the scanning position of the horizontal axis indicates the position of the center horizontal line shown in each measurement region (where at least one of the first Ga-rich regions 21a is assumed to be present). The scanning positions are indicated by positive values below the origin (0 nm) (the AlN layer 12 side) and by negative values above the origin (the active layer 22 side), respectively.

In the EDX measurement, as described above, since the X-rays emitted from the probe positions are weak, even if the respective detection data (X-ray intensity of each composition) of the probe positions are accumulated in the transverse direction at each scanning position, the measurement error is generally large. For example, when the calibration is performed based on the AlN mole fraction (100%) of the AlN layer 12 where the AlN mole fraction is predetermined, the measurement error of the detection data at each scanning position is about ±2 to 3% even near the AlN layer 12 as a reference, and the measurement accuracy further decreases with increasing distance from the AlN layer 12. Therefore, in the present embodiment, in order to suppress the measurement error at the respective scanning positions to about ±2 to 3% even in the region apart from the AlN layer 12, the same sample as the sample piece used for the EDX measurement was used to perform the compositional analysis of Al and Ga in n-type cladding layer 21 by the Rutherford backscattering (RBS) analysis method, and the result obtained by the EDX measurement was calibrated using the RBS analysis result. The AlN mole fraction and the GaN mole fraction of the measurement regions A to E shown in FIGS. 10A to 10E show the calibrated results.

Figure 10A:
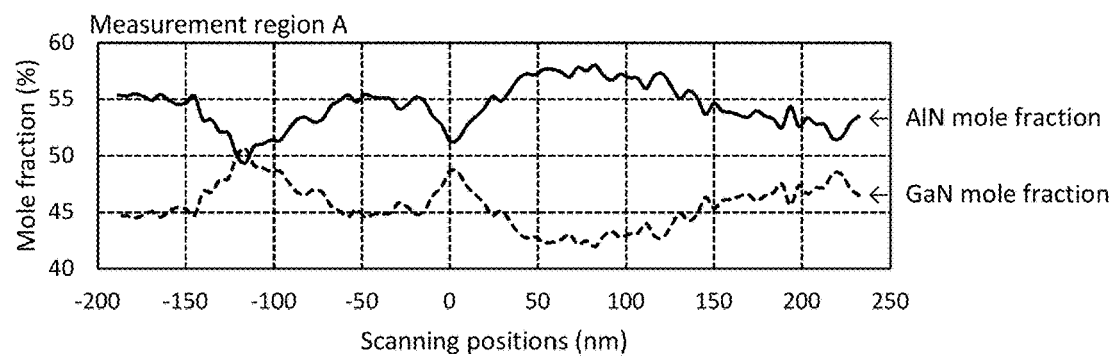
FIG. 10A is a diagram showing measurement results of AlN mole fraction and GaN mole fraction by the line-analysis of the cross-sectional TEM-EDX in the n-type cladding layer in the measurement region A shown in FIG. 9.

From FIG. 10A, in the measurement region A, the presence of the first Ga-rich region 21a can be confirmed in the region A1 at the scanning positions of about −131 nm to about −92 nm and in the region A2 at the scanning positions of about −5 nm to about 10 nm. The AlN mole fractions at nine scanning positions in region A1 are within 49.4% to 52.8% (six of them are within 49% to 52%, three of them are within 49% to 51%). Region A1 includes the scanning position at which the AlN mole fraction is 50%. The AlN mole fractions at four scanning positions in region A2 are within 51.3% to 52.8% (two of them are within 50% to 52%).

Figure 10B:
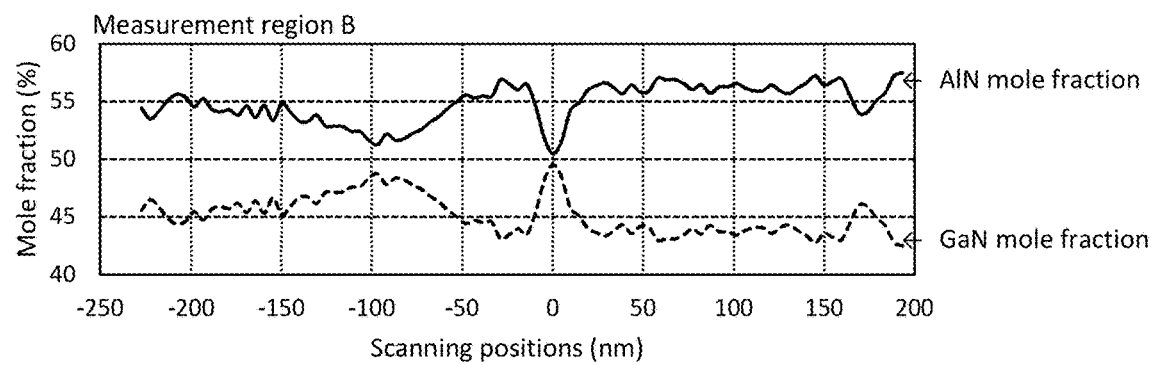
FIG. 10B is a diagram showing measurement results of AlN mole fraction and GaN mole fraction by the line-analysis of the cross-sectional TEM-EDX in the n-type cladding layer in the measurement region B shown in FIG. 9.

From FIG. 10B, in the measurement region B, the presence of the first Ga-rich region 21a can be confirmed in the region B1 at the scanning positions of about −116 nm to about −73 nm and in the region B2 at the scanning positions of about −5 nm to about 5 nm. The AlN mole fractions at ten scanning positions in region B1 are within 51.3% to 52.8% (four of them are within 50% to 52%). The AlN mole fractions at three scanning positions in region B2 are within 50.5% and 51.9% (three of them are within 50% to 52%).

Figure 10C:
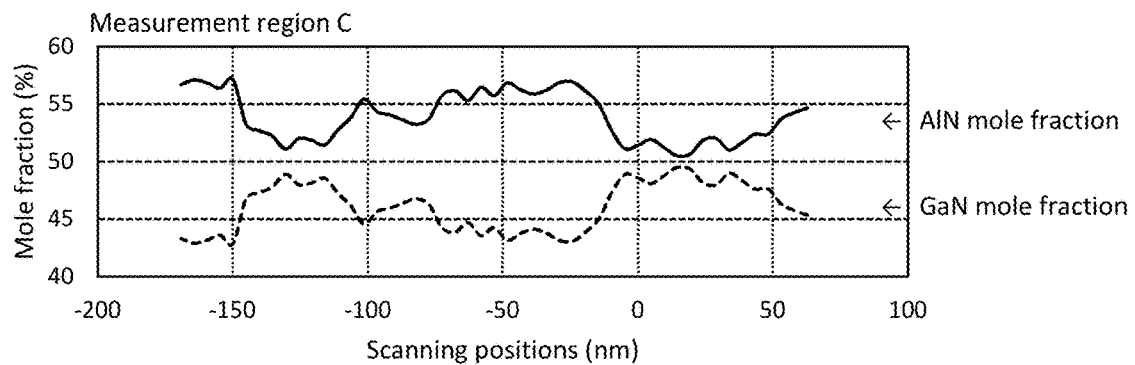
FIG. 10C is a diagram showing measurement results of AlN mole fraction and GaN mole fraction by the line-analysis of the cross-sectional TEM-EDX in the n-type cladding layer in the measurement region C shown in FIG. 9.

From FIG. 10C, in the measurement region C, the presence of the first Ga-rich region 21a can be confirmed in the region C1 at the scanning positions of about −140 nm to about −111 nm and in the region C2 at the scanning positions of about −10 nm to about 48 nm. The AlN mole fractions at seven scanning positions in region C1 are within 51.1% to 52.7% (four of them are within 50% to 52%). The AlN mole fractions at 13 scanning positions in region C2 are 51.1% and 52.7% (nine of them are within 50% to 52%).

Figure 10D:
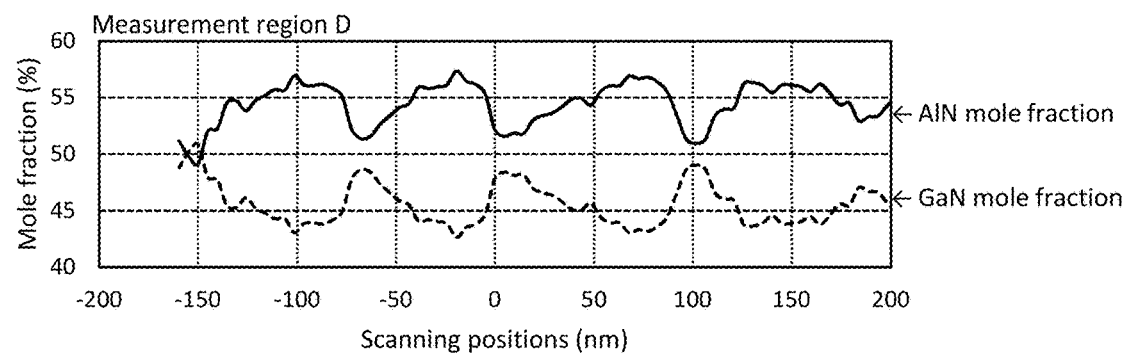
FIG. 10D is a diagram showing measurement results of AlN mole fraction and GaN mole fraction by the line-analysis of the cross-sectional TEM-EDX in the n-type cladding layer in the measurement region D shown in FIG. 9.

From FIG. 10D, in the measurement region D, the presence of the first Ga-rich region 21a can be confirmed in the region D1 at the scanning positions of about −160 nm to about −140 nm, in the region D2 at the scanning positions of about −73 nm to about 158 nm, in the region D3 at the scanning positions of about 0 nm to about 10 nm, and in the region D4 at the scanning positions of about 97 nm to about 106 nm. The AlN mole fractions at five scanning positions in the region D1 are within 49.1% to 52.3% (three of them are within 49% to 52%) and the region D1 includes the scanning position at which the AlN mole fraction is 49.8%. The AlN mole fractions at four scanning positions in the region D2 are within 51.4% to 52.7% (three of them are within 50% to 52%). The AlN mole fractions at four scanning positions in the region D3 are within 51.6% to 52.2% (two of them are within 50% to 52%). The AlN mole fractions at three scanning positions in the region D4 are within 51.0% to 51.3% (three of them are within 50% to 52%).

Figure 10E:
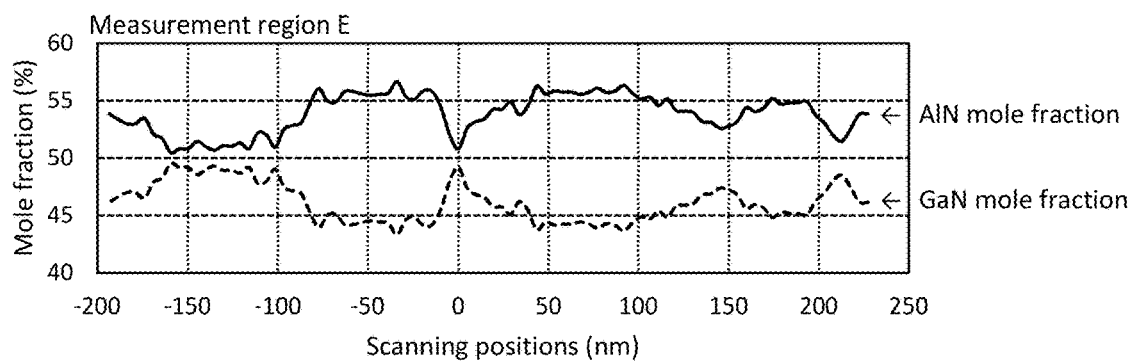
FIG. 10E is a diagram showing measurement results of AlN mole fraction and GaN mole fraction by the line-analysis of the cross-sectional TEM-EDX in the n-type cladding layer in the measurement region E shown in FIG. 9.

From FIG. 10E, in the measurement region E, the presence of the first Ga-rich region 21a can be confirmed in the region E1 at the scanning positions of about −169 nm to about −97 nm and in the region E2 at the scanning positions of about −5 nm to about 5 nm. The AlN mole fractions at 16 scanning positions in region E1 are within 50.5% to 52.5% (eleven of them are within 50% to 52%, six of them are within 50% to 51%). The AlN mole fractions at three scanning positions in region E2 are within 50.8% to 52.6% (two of them are within 50% to 52%).

As observed above, it is possible to confirm the presence of the metastable n-type regions having the AlN mole fraction of 50% in the first Ga-rich region 21a in the respective regions A1, A2, B1, B2, C1, C2, D1 to D4, E1, and E2 of the measurement regions A to E, considering the measurement error of about ±2 to 3% at each scanning position and the possibility that the average AlN mole fraction of the plurality of probe positions aligned in the transverse direction with respect to the first Ga-rich region 21a is higher than the AlN mole fraction of the metastable n-type region. Furthermore, the first Ga-rich regions 21a are present respectively in the measurement regions A and B of the upper portion close to the upper surface of the n-type cladding layer 21, in the measurement region C of the central portion, and in the measurement regions D and E of the lower portion close to the AlN layer 12, and it can be seen that the first Ga-rich regions 21a are uniformly dispersed in the n-type cladding layer 21.

Furthermore, from FIGS. 10A to 10E, it can be confirmed that the AlN mole fractions in the n-type body regions 21b adjacent to the regions A1, A2, B1, B2, C1, C2, D1 to D4, E1, and E2 of the measurement regions A to E are within the range of about 55% to about 58%. As described above, since the target value of the AlN mole fraction of the n-type cladding layer 21 of the sample used for the EDX measurement is 58%, it can be seen that the FIGS. 10A to 10E accurately represent the AlN mole fraction of the n-type body region 21b, considering the measurement error of about ±2 to 3% at each scanning position and the possibility that the average AlN mole fraction of the plurality of probe positions aligned in the transverse direction with respect to the n-type body region 21b is higher or lower than the average AlN mole fraction of the n-type body region 21b.

Next, the measurement results of the AlN mole fractions of the first Ga-rich region 21a and the n-type body region 21b in the n-type cladding layer 21 by the CL (cathodoluminescence) method are described. The sample pieces used for the measurement was prepared in the same manner as the sample pieces used for the observation of HAADF-STEM image shown in FIG. 8.

Figure 11:
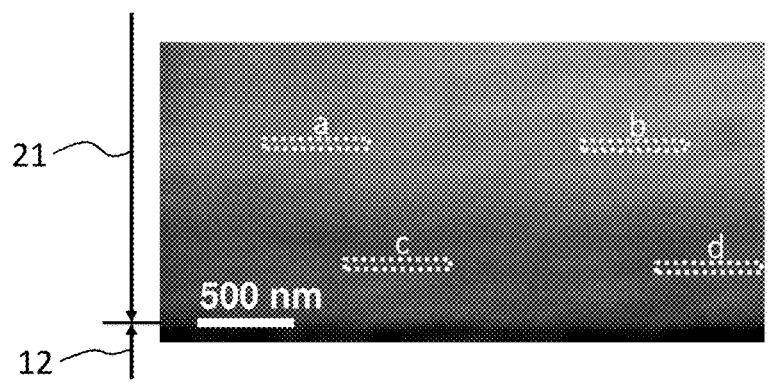
FIG. 11 is a SEM image showing the measurement regions of the AlN mole fraction by the CL method in the n-type cladding layer.

FIG. 11 is a scanning electron microscopy (SEM) image showing a cross section in the n-type cladding layer 21 of the sample piece. The measurement regions (a to d) surrounded by dotted lines in the cross section indicate the incident areas of the electron beam irradiated for the measurement, respectively. The measurement regions a and b are located at about 1000 nm from the upper surface of the AlN layer 12, and the measurement regions c and d are located at about 350 nm from the upper surface of the AlN layer 12. Within each measurement region, the electron beam having a beam diameter of 50 nm was moved laterally and irradiated once each at 50 nm intervals for a total of 10 times to measure the CL spectrum at each irradiation.

Figure 12:
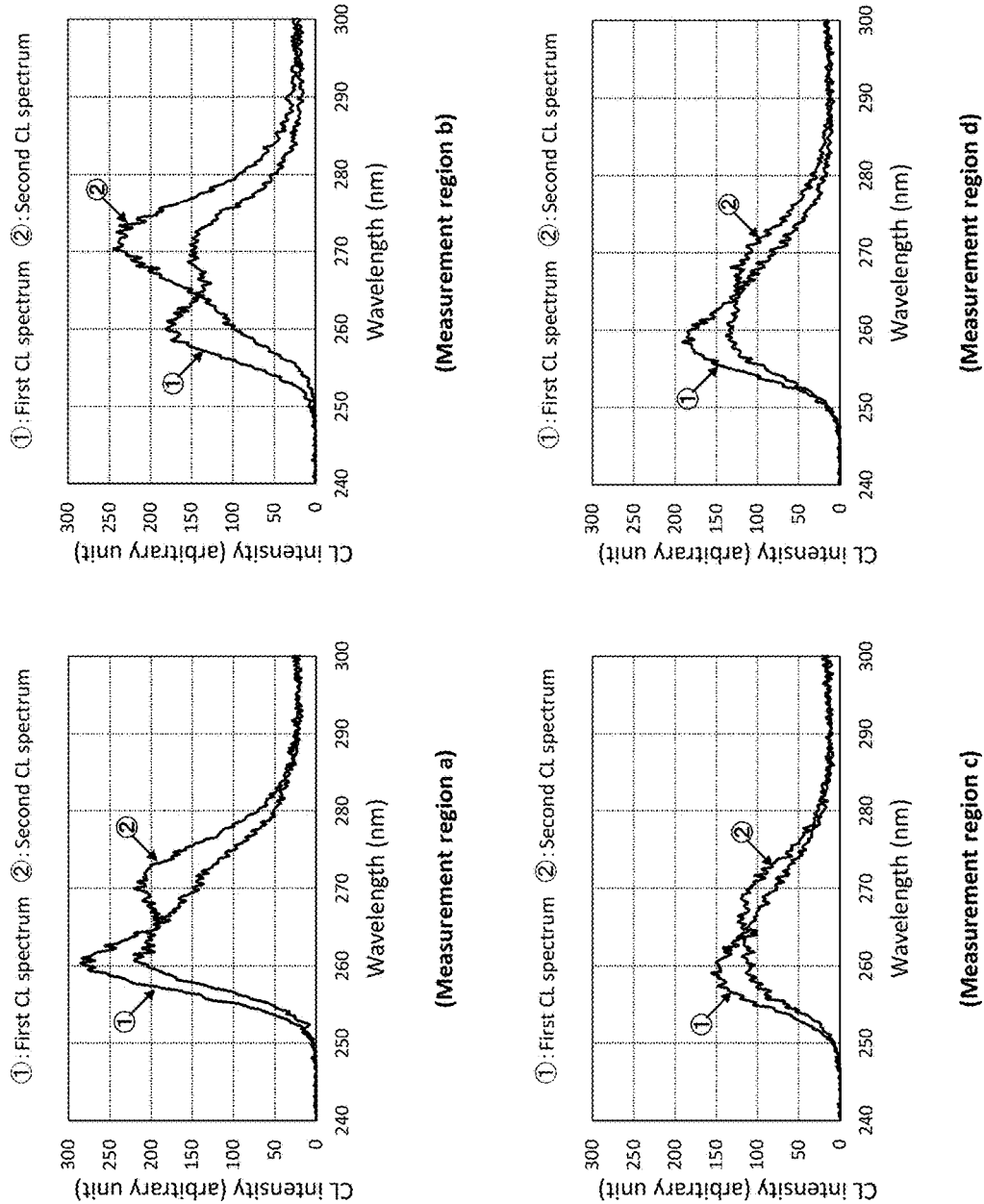
FIG. 12 is a diagram showing the first and second CL spectra calculated from ten CL spectra measured in each measurement region shown in FIG. 11.
Figure 13:
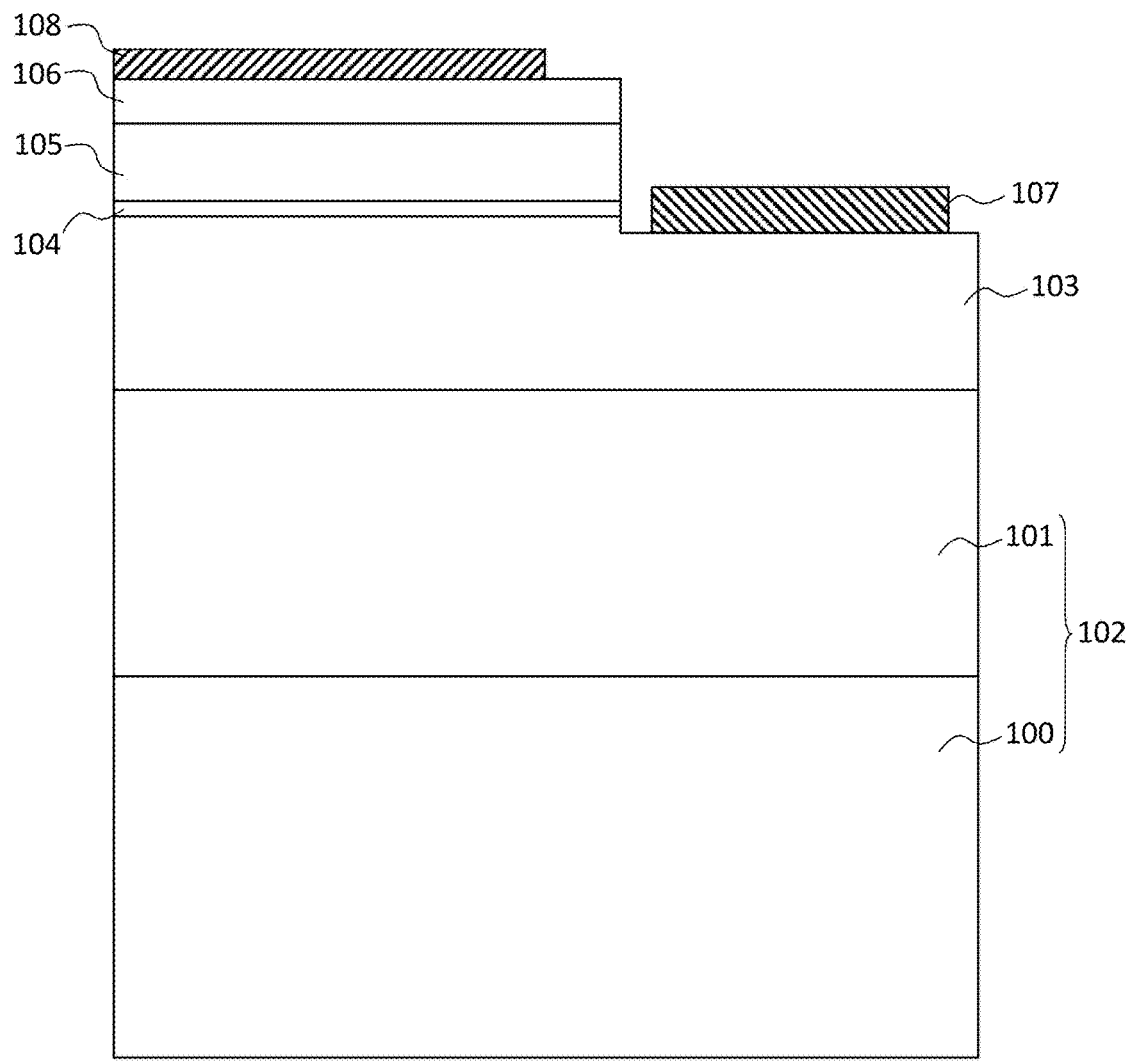
FIG. 13 is a fragmentary cross-sectional view schematically showing an example of an element structure of a general ultraviolet light-emitting diode.

FIG. 12 shows the first CL spectrum and the second CL spectrum for each measurement region (a to d). The first CL spectrum was obtained by averaging two CL spectra whose wavelength distributions are closer to the short wavelength among the ten CL spectra in each measurement region (a to d) and the second CL spectrum was obtained by averaging two CL spectra whose wavelength distributions are closer to the long wavelength among the ten CL spectra in each measurement region (a to d).

Since the distance between both ends of the ten electron-beam centers in each measurement region (a to d) is 450 nm, both the first Ga-rich region 21a and the n-type body region 21b are present in the ten irradiation areas. Since the volume ratio of the first Ga-rich region 21a to the entire n-type cladding layer 21 is small, the first CL spectrum mainly shows the CL spectrum of the n-type body region 21b. On the other hand, the second CL spectrum includes the CL spectrum of the first Ga-rich region 21a. However, since the width in a cross section perpendicular to the extending direction of the first Ga-rich region 21a is about 20 nm on average, the n-type body region 21b may be partially included within the irradiation range of the beam diameter 50 nm. Therefore, the second CL spectrum is a composite spectrum of the CL spectrum of the first Ga-rich region 21a and the CL spectrum of the n-type body region 21b. However, if the center of each electron beam of the two CL spectra whose wavelength distributions are closer to the long wavelength is located at the widthwise center of the first Ga-rich region 21a, it is likely that the electron beam of the central portion within the irradiation range will gather in the first Ga-rich region 21a with lower energy level to excite the first Ga-rich region 21a exclusively, and it is considered that the second CL spectrum mainly shows the CL spectrum of the first Ga-rich region 21a.

Here, the reason why the first CL spectrum is the average of the two CL spectra whose wavelength distributions are closer to the short wavelength and the second CL spectrum is the average of the two CL spectra whose wavelength distributions are closer to the long wavelength is as follows. The irradiation positions of the electron beam at each measurement region are set at random, so that the irradiation ranges of one CL spectrum closest to the short wavelength and the one closest to the long wavelength are different for each measurement region, and the measurement results are largely varied for each measurement region. Also, it may be difficult to sort out one CL spectrum closest to the shortest wavelength and the one closest the long wavelength. Therefore, it was decided to mechanically select two CL spectra whose wavelength distributions are closer to the short wavelength and the other two CL spectra whose wavelength distributions are closer to the long wavelength, respectively and to take the averages of the respective two CL spectra in order to suppress the variation for each measurement region.

First, the first CL spectrum of each measurement region (a to d) will be discussed. In the measurement region a, a peak of emission wavelength exists near about 260 nm. In the measurement region b, gradual peaks of emission wavelength exist at two locations near about 260 nm and near about 269 nm. In the measurement region c, a peak of emission wavelength exists near about 259 nm. In the measurement region d, a peak of emission wavelength exists near about 258 nm.

The peak wavelength of about 258 nm to about 260 nm in each measurement region (a to d) corresponds to about 59% to about 61% in terms of the AlN mole fraction, and the above CL wavelength of the first CL spectrum generally coincides with the average AlN mole fraction Xb (~target value 58%) of the n-type body region 21b in consideration of a measurement error of about ±3% in terms of the AlN mole fraction.

In addition, in the first CL spectra of the measurement regions a, c and d, the long wavelength component longer than a peak wavelength of about 258 nm to about 260 nm is larger than the short wavelength component shorter than the same peak wavelength, and it can be seen that the mass-transfer of Ga occurs within two irradiation ranges corresponding to the first CL spectrum of each measurement region. Furthermore, the peak wavelength of about 269 nm of the first CL spectrum in the measurement region b corresponds to about 54%±3% in terms of the AlN mole fraction, and generally coincides with the CL wavelength from the metastable neighbor n-type region, whose AlN mole fraction is slightly higher than 50%, in the first Ga-rich region 21a. Therefore, a portion of the two irradiation ranges corresponding to the first CL spectrum of the measurement region b includes the first Ga-rich region 21a formed by the mass-transfer of Ga.

Next, the second CL spectrum of each measurement region (a to d) will be discussed. In the measurement region a, gradual peaks of emission wavelength exist at two locations near about 262 nm and near around 270 nm. In the measurement region b, a gradual peak of emission wavelength exists within a range of about 270 nm to around 273 nm. In the measurement region c, a gradual peak of emission wavelength exists within a range of about 266 nm to around 269 nm, and the overall plateau-like peak region extends in the range of about 261 nm to about 270 nm. In the measurement region d, gradual peaks of emission wavelengths exist near about 259 nm and near around 268 nm, and the overall plateau-like peak region extends in the range of about 258 nm to about 269 nm.

The peak wavelength of about 270 nm to about 273 nm in the measurement regions a and b corresponds to about 51% to about 53% in terms of the AlN mole fraction, and generally coincides with the CL wavelength (about 275 nm) corresponding to the metastable n-type region having the AlN mole fraction of 50% present in the first Ga-rich region 21a in consideration of a measurement error of about ±3% in terms of AlN mole fraction. The second CL spectra of the measurement regions a and b also include the CL wavelength of about 275 nm, which corresponds to the metastable n-type region, with an emission intensity of about 72 to 78% of the peak intensity. However, the peak wavelength of about 270 nm to about 273 nm is about 2 to 5 nm shorter than the CL wavelength (about 275 nm) corresponding to metastable n-type region. In addition, in each of the second CL spectra of the measured regions a and b, a gradual peak or shoulder (undulation) of the emission wavelength is present around about 262 nm. These indicate that each of the second CL spectra of the measured regions a and b appears as a composite spectrum of the respective CL spectra of the metastable n-type region and the metastable neighbor n-type region having slightly higher AlN mole fraction than the metastable n-type region in the first Ga-rich region 21a and the CL spectrum of the n-type body region 21b. Furthermore, in the second CL spectrum of the measurement region a, the proportion of the CL spectrum of the n-type body region 21b in the composite spectrum is larger than that of the measurement region b.

On the other hand, in the second CL spectra of the measurement regions c and d, a long-wavelength end of the plateau-like peak region is about 269 nm to 270 nm, which corresponds to about 53% to 54% in terms of the AlN mole fraction, and generally coincides with the CL wavelength (about 275 nm) corresponding to the metastable n-type region having the AlN mole fraction of 50% present in the first Ga-rich region 21a in consideration of a measurement error of about ±3% in terms of AlN mole fraction. The second CL spectra of the measurement regions c and d include the CL wavelength of about 275 nm corresponding to the metastable n-type region with an emission intensity of about 49% to 55% of the peak intensity. These indicate that the second CL spectra of the measurement regions c and d appear as the composite spectrum of the respective CL spectra of the metastable n-type region and the metastable neighbor n-type region in the first Ga-rich region 21a and the CL spectrum of the n-type body region 21b, as with the measurement regions a and b. In the second CL spectra of the measurement regions c and d, the proportion of the CL spectrum of the n-type body region 21b in the composite spectrum is larger than that of the measurement regions a and b.

As described above, from the first CL spectra in the respective measurement regions a to d shown in FIG. 12, the AlN mole fraction of the n-type body region 21b almost coincides with the target value 58% of the AlN mole fraction of the n-type cladding layer 21. Furthermore, from the second CL spectra in the respective measurement regions a to d, it can be seen that the first Ga-rich region 21a includes not only the metastable n-type region having the AlN mole fraction of 50% and also the metastable neighbor n-type region having the AlN mole fraction higher than that of the metastable n-type region. Furthermore, the analysis results shown in the first and second CL spectra in the measurement regions a to d shown in FIG. 12 are in good agreement with the analysis results obtained by the EDX measurement shown in FIGS. 10A to 10E, although there are differences in the spatial resolution and the like due to differences in analysis methods.

It should be noted that, from the second CL spectra in the respective measurement regions a to d shown in FIG. 12, the abundance ratio of the metastable n-type region in the first Ga-rich region 21a tends to change depending on the position in n-type cladding layer 21. However, since there are many uncertainties, detailed examination is omitted.

Here, even if the abundance ratio of the metastable n-type region is small at the region close to the AlN-layer 12 in the n-type cladding layer 21, the effect of the present invention is not necessarily reduced. As described above, the carriers (electrons) in the n-type cladding layer 21 are localized in the first Ga-rich region 21a, so that the current can flow preferentially through the first Ga-rich region in the n-type cladding layer 21 stably thereby suppressing variation in the properties of the light-emitting element. However, since the active layer 22, which is a light-emitting region, is located above the n-type cladding layer 21, the localization is remarkable in the vicinity of the upper surface of the n-type cladding layer 21 which is in contact with the active layer 22. Therefore, even if the above localization is insufficient in the area close to the AlN-layer 12 in the n-type cladding layer 21, it is possible to suppress the variation in the properties of the light-emitting element in the same manner. Further, in the element configuration shown in FIG. 4, since the forward current flows more in the upper layer side than in the lower layer side in the n-type cladding layer 21, it is considered that there is almost no effect of the insufficient localization in the area close to the AlN layer 12 in the n-type cladding layer 21.

Second Embodiment

In the first embodiment, when the barrier layer 221 is composed of an AlGaN based semiconductor having an AlN mole fraction of not 100%, it is described as an example that the AlN mole fraction of the entire barrier layer 221 including the second Ga-rich region 221a is in the range of 50% to 90%, the AlN mole fraction of the barrier body region 221b is in the range of 51% to 90%, and the difference in the AlN mole fraction between the second Ga-rich region 221a and the barrier body region 221b is 1% or more in order to ensure the effectiveness of the localization of carriers in the second Ga-rich region 221a.

In the second embodiment, similarly to the first Ga-rich regions 21a of the n-type cladding layer 21 in the first embodiment, the second Ga-rich region 221a of the barrier layer 221 is also preferable to be composed of the metastable AlGaN. Here, since the AlN mole fraction of the entire barrier layer 221 is in the range of 50% to 90%, in the first metastable AlGaN applicable to the second Ga-rich region 221a, the AlGaN composition ratio is an integer ratio of $Al_1Ga_1N_2$, $Al_2Ga_1N_3$ or $Al_5Ga_1N_6$. Although the second metastable AlGaN of $Al_7Ga_5N_{12}$ or $Al_3Ga_1N_4$ is also considered to be applicable to the second Ga-rich region 221a, it is preferable to use a more stable $Al_3Ga_1N_4$ if the second metastable AlGaN is daringly used. In the second metastable AlGaN of $Al_{11}Ga_1N_{12}$, since the composition ratio of Al is too high, before easy-to-move Ga enters sites which compose a symmetric arrangement, the quantitatively large amount of Al randomly enters the sites, so that the atomic arrangement of Al and Ga is likely not to be a symmetric arrangement and is close to the random state, and the above stability is reduced. Therefore, it is considered difficult to apply this second metastable AlGaN to the second Ga-rich region 221a, When the second Ga-rich region 221a is composed of a metastable AlGaN of $Al_1Ga_1N_2$, $Al_2Ga_1N_3$, $Al_3Ga_1N_4$, or $Al_5Ga_1N_6$, the AlN mole fraction of the barrier body region 221b is preferably in a range of 51% to 66%, 68% to 74%, 76% to 82%, or 85% to 90%, depending on the four AlN mole fractions of the second Ga-rich region 221a. Here, when the second Ga-rich region 221a is composed of the metastable AlGaN of $Al_5Ga_1N_6$, it is preferable to set the AlN mole fraction of the barrier body region 221b not to exceed 90% in order to prevent low stable $Al_1Ga_1N_{12}$ being randomly mixed.

In the manufacturing method of the second Ga-rich region 221a and the barrier body region 221b in the barrier layer 221, as described above, the barrier layer 221 is grown under the growth conditions in which multi-step terraces easily appear using the AlN mole fraction set for the barrier body region 221b as a target value in the same manner as the n-type cladding layer 21.

When the first metastable AlGaN of $Al_1Ga_1N_2$ is grown in the second Ga-rich region 221a, the target value Xd of the AlN mole fraction of the barrier layer 221 is set within the range of 51% to 66% as well as the target value Xa of the AlN mole fraction of the n-type cladding layer 21. Similarly when the first metastable AlGaN of $Al_2Ga_1N_3$ is grown in the second Ga-rich region 221a, the target value Xd of the AlN mole fraction of the barrier layer 221 is set within the range of 68% to 74%, and when the second metastable AlGaN of $Al_3Ga_1N_4$ is grown in the second Ga-rich region 221a, the target value Xd of the AlN mole fraction of the barrier layer 221 is set within the range of 76% to 82%, and when the first metastable AlGaN of $Al_5Ga_1N_6$ is grown in the second Ga-rich region 221a, the target value Xd of the AlN mole fraction of the barrier layer 221 is set within the range of 85% to 90%.

Therefore, the target value Xd of the AlN mole fraction of the barrier layer 221 is set within a range of 1% or higher than the AlN mole fraction of the metastable AlGaN formed in the second Ga-rich region 221a (target metastable AlGaN) and less than the AlN mole fraction of the metastable AlGaN which is nearest to and larger than that of the target metastable AlGaN. Therefore, as with the first Ga-rich region 21a of the n-type cladding layer 21, the target metastable AlGaN can be stably formed in the second Ga-rich region 221a, and 1% or more of the AlN mole fraction difference between the second Ga-rich region 221a and the barrier body region 221b is ensured, and the carriers in the barrier layer 221 are localized in the second Ga-rich region 221a having a smaller band gap energy than the barrier body region 221b.

Because the second Ga-rich region 221a is composed of highly stable metastable AlGaN, variation in the mole fraction of mixed crystals caused by the drift of the crystal growth apparatus or the like is suppressed, and the second Ga-rich region 221a in which carrier localization occurs in the barrier layer 221 is stably formed with the AlN mole fraction corresponding to the metastable AlGaN used. Consequently the current can stably flow preferentially through the second Ga-rich region 221a even in the barrier layer 221 as in the n-type cladding layer 21, and the variation in the properties of the light-emitting element 1 can be suppressed.

Other Embodiments

Modifications of the first and second embodiments will be described below.

(1) In the first and second embodiments, the active layer 22 was assumed to be composed of the multi-quantum-well structure in which the well layer 220 and the barrier layer 221 are stacked alternately where the well layer 220 includes two or more layers composed of a GaN-based semiconductor and the barrier layer 221 includes one or more layers composed of an AlGaN-based semiconductor or an AlN-based semiconductor. However, the active layer 22 may be configured with a single quantum-well structure having only one layer of the well layer 220, and it may be configured not to include the barrier layer 221 (quantum barrier layer). It is obvious that the advantages of the n-type cladding layer 21 adopted in the above-described embodiments can be obtained in the same manner for such a single-quantum-well structure.

(2) In the above embodiments, as an example of the growth condition of the n-type cladding layer 21, the supply amount and the flow rate of the source gases and the carrier gas used in the MOVPE method are set in accordance with the average AlN mole fraction of the entire n-type AlGaN layer constituting the n-type cladding layer 21. That is, when the average AlN mole fraction of the entire n-type cladding layer 21 is set to a constant value vertically it is assumed that the supply amount and the flow rate of the source gases and the like are controlled to be constant. However, the supply amount and the flow rate of the source gases and the like are not necessarily controlled to be constant.

(3) In the above embodiments, the planarly-viewed shapes of the first region R1 and the p-electrode 26 are exemplarily a comb-like shape, but the planarly-viewed shapes are not limited to the comb-like shape. In addition, a plurality of the first regions R1 may be present, and each of them may be formed in a planarly-viewed shape surrounded by one second region R2.

(4) In the above embodiments, the case using the underlying part 10, in which the sapphire substrate 11 in which the main surface has a miscut angle with respect to the (0001) surface is used and the multi-step terraces appear on the surface of the AlN layer 12, is exemplified. However, the magnitude of the miscut angle and the direction in which the miscut angle is provided (specifically the direction in which the (0001) surface is inclined, for example, the m-axis direction, the a-axis direction, and the like) may be arbitrarily determined as long as the multi-step terraces appear on the surface of the AlN layer 12 and the growth start points of the first Ga-rich region 21a are formed.

(5) In the above embodiments, as illustrated in FIG. 1, the light-emitting element 1 having the underlying part 10 including the sapphire substrate 11 is illustrated as the light-emitting element 1, but the sapphire substrate 11 (or a part or all of layers included in the underlying part 10) may be removed by lift-off or the like. Furthermore, the substrate constituting the underlying part 10 is not limited to the sapphire substrate.

INDUSTRIAL APPLICABILITY

The present invention is available to a nitride semiconductor ultraviolet light-emitting element which comprises an active layer having a quantum-well structure having one or more well layers composed of a GaN-based semiconductor and has a peak emission wavelength within a range of 300 nm to 327 nm.

DESCRIPTION OF SYMBOLS

1 Nitride semiconductor ultraviolet light-emitting element
10 underlying part
11 sapphire substrate
11a main surface of sapphire substrate
12 AlN layer
20 light-emitting element structure part
21 n-type cladding layer (n-type layer)
21a first Ga-rich region (n-type layer)
21b n-type body region (n-type layer)
22 active layer
220 well layer
221 barrier layer
221a second Ga-rich region
221b barrier body region
23 electron blocking layer (p-type layer)
24 p-type cladding layer (p-type layer)
25 p-type contact layer (p-type layer)
26 p-electrode
27 n-electrode
100 substrate
101 AlGaN-based semiconductor layer
102 template
103 n-type AlGaN-based semiconductor layer
104 active layer
105 p-type AlGaN-based semiconductor layer
106 p-type contact layer
107 n-electrode
108 p-electrode
BL boundary line between first region and second region
BA boundary region (inclined region)
R1 first region
R2 second region
T terrace
TA terrace region

The invention claimed is:

1. A nitride semiconductor ultraviolet light-emitting element comprising:
a light-emitting element structure part in which an n-type layer, an active layer, and a p-type layer made of an AlGaN-based semiconductor of wurtzite structure are stacked vertically, wherein
the nitride semiconductor ultraviolet light-emitting element has a peak emission wavelength within a range of 300 nm to 327 nm,
the n-type layer is composed of an n-type AlGaN-based semiconductor,
the active layer disposed between the n-type layer and the p-type layer has a quantum-well structure having one or more well layers composed of a GaN-based semiconductor,
the p-type layer is composed of a p-type AlGaN-based semiconductor,
each semiconductor layer in the n-type layer and the active layer is an epitaxially grown layer having a surface on which multi-step terraces parallel to a (0001) plane are formed,
the n-type layer has a plurality of first Ga-rich regions, the plurality of first Ga-rich regions being stratiform regions uniformly distributed in the n-type layer with locally lower AlN mole fraction and including n-type AlGaN regions in which an AlGaN composition ratio is an integer ratio of $Al_1Ga_1N_2$,
each extending direction of the first Ga-rich regions on a first plane perpendicular to an upper surface of the n-type layer is inclined with respect to an intersection line between the upper surface of the n-type layer and the first plane, and
an AlN mole fraction of an n-type body region outside the stratiform regions in the n-type layer is within a range of 54% to 66%.

2. The nitride semiconductor ultraviolet light-emitting element according to claim 1, wherein the peak emission wavelength is set within a range of 300 nm to 327 nm with a thickness of a boundary region between adjacent terraces of the multi-step terraces of the well layer being within a range of 2 unit cells to 4 unit cells in c-axis direction and with AlN mole fractions of two AlGaN-based semiconductor layers vertically adjacent to the top and bottom of the well layer being within a range of 50% to 100%.

3. The nitride semiconductor ultraviolet light-emitting element according to claim 1, wherein
the active layer has a multi-quantum-well structure including two or more well layers, and
a barrier layer composed of AlGaN-based semiconductor is present between two of the well layers.

4. The nitride semiconductor ultraviolet light-emitting element according to claim 1, wherein
the barrier layer is composed of an AlGaN-based semiconductor having an AlN mole fraction within a range of 50% to 90%, and
boundary region parts between adjacent terraces of the multi-step terraces of the barrier layer located at least on the most p-type layer side between two of the well layers is a second Ga-rich region with a locally lower AlN mole fraction within the same barrier layer.

5. The nitride semiconductor ultraviolet light-emitting element according to claim 4, wherein
an AlGaN region in which an AlGaN composition ratio is an integer ratio of $Al_1Ga_1N_2$, $Al_2Ga_1N_3$, $Al_3Ga_1N_4$ or $Al_5Ga_1N_6$ exists in the second Ga-rich region of the barrier layer.

6. The nitride semiconductor ultraviolet light-emitting element according to claim 1, comprising an underlying part containing a sapphire substrate, wherein
the sapphire substrate has a main surface inclined by a predetermined angle with respect to the (0001) plane,
the light-emitting element structure part is formed above the main surface, and
each semiconductor layer at least from the main surface of the sapphire substrate to the surface of the active layer is an epitaxially grown layer having a surface on which multi-step terraces parallel to the (0001) plane are formed.

7. A method for manufacturing a nitride semiconductor ultraviolet light-emitting element having a peak emission wavelength within a range of 300 nm to 327 nm and comprising a light-emitting element structure part in which an n-type layer, an active layer, and a p-type layer made of an AlGaN-based semiconductor of wurtzite structure are stacked vertically, the method comprising:
a first operation of epitaxially growing the n-type layer of an n-type AlGaN-based semiconductor on an underlying part including a sapphire substrate having a main surface inclined by a predetermined angle with respect to a (0001) plane, and making multi-step terraces parallel to the (0001) plane appear on a surface of the n-type layer, a second operation of epitaxially growing the active layer of a quantum-well structure having one or more well layers composed of a GaN-based semiconductor on the n-type layer, and making multi-step terraces parallel to the (0001) plane appear on a surface of the well layer, and a third operation of forming the p-type layer of a p-type AlGaN-based semiconductor on the active layer by epitaxial growth, wherein in the first operation, a target AlN mole fraction of the n-type layer is set within a range of 54% to 66% and a plurality of first Ga-rich regions are grown so as to extend obliquely upward, the plurality of first Ga-rich regions being stratiform regions uniformly distributed in the n-type layer with locally lower AlN mole fraction and including n-type AlGaN regions in which an AlGaN composition ratio is an integer ratio of $Al_1Ga_1N_2$.

8. The method for manufacturing a nitride semiconductor ultraviolet light-emitting element according to claim 7, comprising:

setting a thickness of a boundary region between adjacent terraces of the multi-step terraces of the well layer within a range of 2 unit cells to 4 unit cells in c-axis direction and AlN mole fractions of two AlGaN-based semiconductor layers vertically adjacent to the top and bottom of the well layer within a range of 50% to 100% for the peak emission wavelength to be within a range of 300 nm to 327 nm, in the second operation, growing the well layer, and in at least one of the first operation, the second operation, and the third operation, growing the two AlGaN-based semiconductor layers vertically adjacent to the top and bottom of the well layer.

9. The method for manufacturing a nitride semiconductor ultraviolet light-emitting element according to claim 7, comprising in the second operation, stacking a well layer composed of a GaN-based semiconductor and a barrier layer composed of an AlGaN-based semiconductor alternately by epitaxial growth, and forming the active layer of the multi-quantum-well structure including two or more well layers, in which multi-step terraces parallel to the (0001) plane appear on each surface of the barrier layer and the well layer.

10. The method for manufacturing a nitride semiconductor ultraviolet light-emitting element according to claim 9, comprising:

in the second operation, setting a target AlN mole fraction of the barrier layer with a range of 55% to 90%, and forming a second Ga-rich region having a locally lower AlN mole fraction within the same barrier layer in boundary region parts between the terraces of the barrier layer located at least on the most p-type layer side between two of the well layers.

11. The method for manufacturing a nitride semiconductor ultraviolet light-emitting element according to claim 10, comprising:

in the second operation,

1) Growing an AlGaN region in which an AlGaN composition ratio is an integer ratio of $Al_1Ga_1N_2$ in the second Ga-rich region by setting a target AlN mole fraction of the barrier layer within a range of 51% to 66%, or 2) Growing an AlGaN region in which an AlGaN composition ratio is an integer ratio of $Al_2Ga_1N_3$ in the second Ga-rich region by setting a target AlN mole fraction of the barrier layer within a range of 68% and 74%, or 3) Growing an AlGaN region in which an AlGaN composition ratio is an integer ratio of $Al_3Ga_1N_4$ in the second Ga-rich region by setting a target AlN mole fraction of the barrier layer within a range of 76% to 82%, or 4) Growing an AlGaN region in which an AlGaN composition ratio is an integer ratio of $Al_5Ga_1N_6$ in the second Ga-rich region by setting a target AlN mole fraction of the barrier layer within a range of 85% to 90%.

* * * * *